United States Patent
Sawada

(10) Patent No.: US 12,388,403 B2
(45) Date of Patent: Aug. 12, 2025

(54) CIRCUIT DEVICE AND OSCILLATOR

(71) Applicant: SEIKO EPSON CORPORATION, Tokyo (JP)

(72) Inventor: Mitsuaki Sawada, Fujimi (JP)

(73) Assignee: SEIKO EPSON CORPORATION (JP)

( * ) Notice: Subject to any disclaimer, the term of this patent is extended or adjusted under 35 U.S.C. 154(b) by 8 days.

(21) Appl. No.: 18/585,456

(22) Filed: Feb. 23, 2024

(65) Prior Publication Data
US 2024/0291434 A1 Aug. 29, 2024

(30) Foreign Application Priority Data
Feb. 24, 2023 (JP) .................. 2023-027020

(51) Int. Cl.
*H03B 5/36* (2006.01)
*H03B 5/04* (2006.01)
(52) U.S. Cl.
CPC ............ *H03B 5/36* (2013.01); *H03B 5/04* (2013.01); *H03B 2200/009* (2013.01)
(58) Field of Classification Search
CPC ........................................... H03B 5/36
USPC ........................................ 331/116 R
See application file for complete search history.

(56) References Cited

U.S. PATENT DOCUMENTS

| | | | |
|---|---|---|---|
| 2003/0025568 A1 | 2/2003 | Kubo et al. | |
| 2020/0313614 A1* | 10/2020 | Sawada | G05F 3/20 |
| 2020/0313658 A1* | 10/2020 | Kozaki | H03K 19/20 |
| 2020/0321944 A1* | 10/2020 | Nomura | H04L 25/029 |
| 2023/0208358 A1* | 6/2023 | Beppu | H03H 9/1021 |
| | | | 331/66 |

FOREIGN PATENT DOCUMENTS

JP 2003-046338 A 2/2003

* cited by examiner

*Primary Examiner* — Joseph Chang
(74) *Attorney, Agent, or Firm* — Harness, Dickey & Pierce, P.L.C.

(57) ABSTRACT

A circuit device includes an oscillation circuit configured to generate an oscillation signal, a waveform shaping circuit configured to perform waveform shaping on the oscillation signal, and a regulator configured to supply a regulated power supply voltage to the waveform shaping circuit. The circuit device further includes an amplitude detection circuit configured to detect the amplitude of the oscillation signal and output an amplitude detection signal, and a power supply control circuit configured to perform control on the regulator based on the amplitude detection signal, such that the regulated power supply voltage becomes smaller than the amplitude of the oscillation signal.

10 Claims, 18 Drawing Sheets

CIRCUIT DEVICE AND OSCILLATOR

The present application is based on, and claims priority from JP Application Serial Number 2023-027020, filed Feb. 24, 2023, the disclosure of which is hereby incorporated by reference herein in its entirety.

BACKGROUND

1. Technical Field

The present disclosure relates to a circuit device, an oscillator, and the like.

2. Related Art

A circuit device including an oscillation circuit is provided with a waveform shaping circuit that shapes a sine wave oscillation signal generated by the oscillation circuit into a rectangular wave signal. For example, JP-A-2003-046338 discloses, as a technique in the related art, a quartz crystal oscillator having a circuit configuration in which an oscillation stage and a buffer stage are provided and an output level of a rectangular wave of a buffer stage inverter is limited to be small. In addition, JP-A-2003-046338 describes, as the related art, that a magnitude relationship between a power supply voltage Vd1 supplied to the oscillation stage and a power supply voltage Vd2 supplied to the buffer stage inverter is set to Vd2<Vd1.

JP-A-2003-046338 is an example of the related art.

However, JP-A-2003-046338 does not disclose control on the power supply voltage of the oscillation stage or on the power supply voltage of the buffer stage. In addition, in the configuration described as the related art in JP-A-2003-046338, it is unclear how the magnitude of the power supply voltage is specifically determined. In an actual oscillator, it is assumed that an oscillation amplitude fluctuates due to, for example, a type of the resonator, manufacturing variations of the resonator and a circuit element, and environmental fluctuations. A method for reliably controlling the power supply voltage of the oscillation stage to be higher than the power supply voltage of the buffer stage inverter in a subsequent stage even when the oscillation amplitude is not uniform as described above is not clarified in JP-A-2003-046338.

SUMMARY

An aspect of the present disclosure relates to a circuit device including: an oscillation circuit configured to generate an oscillation signal; a waveform shaping circuit configured to receive the oscillation signal and perform waveform shaping on the oscillation signal; a regulator configured to supply a regulated power supply voltage to the waveform shaping circuit; an amplitude detection circuit configured to detect an amplitude of the oscillation signal and output an amplitude detection signal; and a power supply control circuit configured to perform control on the regulator based on the amplitude detection signal, such that the regulated power supply voltage becomes smaller than the amplitude of the oscillation signal.

Another aspect of the present disclosure relates to an oscillator including a resonator and a circuit device. The circuit device includes an oscillation circuit configured to oscillate the resonator and generate an oscillation signal; a waveform shaping circuit configured to receive the oscillation signal and perform waveform shaping on the oscillation signal; a regulator configured to supply a regulated power supply voltage to the waveform shaping circuit; an amplitude detection circuit configured to detect an amplitude of the oscillation signal and output an amplitude detection signal; and a power supply control circuit configured to perform control on the regulator based on the amplitude detection signal, such that the regulated power supply voltage becomes smaller than the amplitude of the oscillation signal.

DESCRIPTION OF EMBODIMENTS

Hereinafter, the embodiment will be described. It should be noted that the embodiment described below is not intended to limit the scope of the claims. Further, all of the components described in the embodiment are not necessarily essential components.

1. Circuit Device and Oscillator

Figure 1:
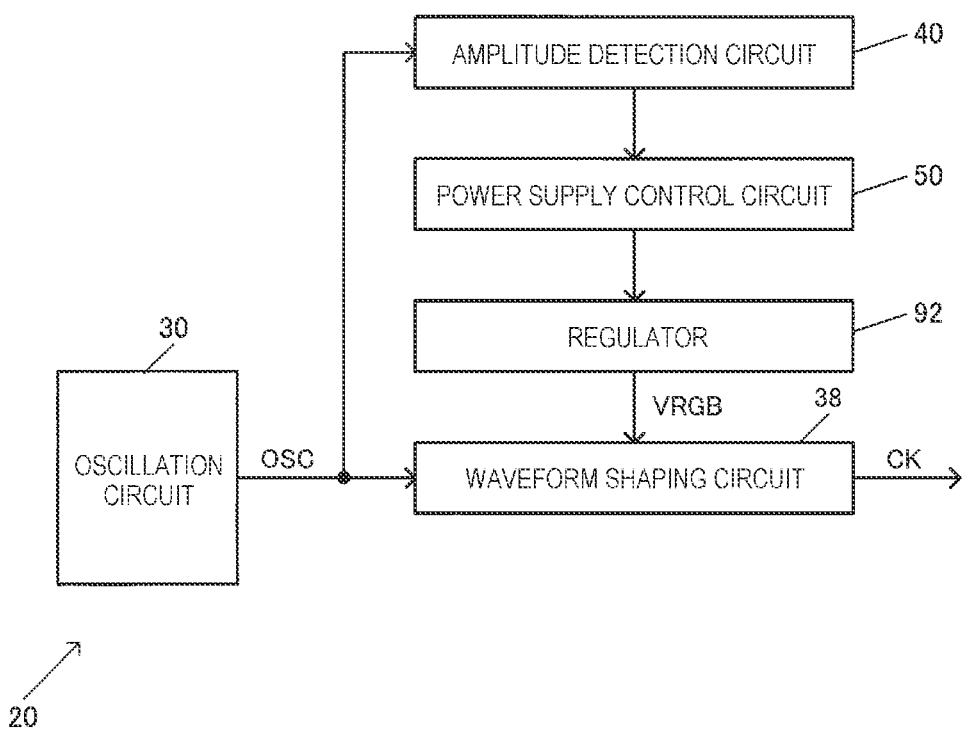
FIG. 1 shows a configuration example of a circuit device according to the embodiment.

FIG. 1 shows a configuration example of a circuit device 20 according to the embodiment. The circuit device 20 according to the embodiment includes an oscillation circuit 30, a waveform shaping circuit 38, an amplitude detection circuit 40, a power supply control circuit 50, and a regulator 92.

The oscillation circuit 30 generates an oscillation signal OSC. For example, the oscillation circuit 30 generates the oscillation signal OSC by oscillating a resonator or the like. Alternatively, the oscillation circuit 30 may generate the oscillation signal OSC by an LC resonance circuit or the like. The oscillation signal OSC is, for example, a sine wave signal. The oscillation circuit 30 includes a drive circuit or the like for generating the oscillation signal OSC by driving the resonator or the like.

The waveform shaping circuit 38 receives the oscillation signal OSC from the oscillation circuit 30 and performs waveform shaping on the oscillation signal OSC. Then, the waveform shaping circuit 38 performs the waveform shaping on, for example, the sine wave oscillation signal OSC and outputs a rectangular wave clock signal CK. The waveform shaping circuit 38 includes one or more buffer circuits for performing the waveform shaping on the oscillation signal OSC.

The regulator 92 supplies a regulated power supply voltage VRGB to the waveform shaping circuit 38. For example, the regulator 92 performs a regulating operation of stepping down a received power supply voltage, generates the regulated power supply voltage VRGB, and supplies the generated regulated power supply voltage VRGB to the waveform shaping circuit 38. The waveform shaping circuit 38 performs the waveform shaping on the oscillation signal OSC using the regulated power supply voltage VRGB as a power supply voltage. For example, the waveform shaping circuit 38 performs the waveform shaping on the oscillation signal OSC by the buffer circuit operating with the regulated power supply voltage VRGB.

The amplitude detection circuit 40 detects an amplitude of the oscillation signal OSC and outputs an amplitude detection signal. The amplitude detection signal is a signal indicating a magnitude of the amplitude of the oscillation signal OSC, and changes according to the magnitude of the amplitude. For example, the amplitude detection signal is a voltage corresponding to the amplitude of the oscillation signal OSC, and is a voltage that increases as the amplitude increases. For example, the amplitude detection circuit 40 detects and outputs a peak voltage of the oscillation signal OSC as the amplitude detection signal corresponding to the amplitude of the oscillation signal OSC. Alternatively, the amplitude detection circuit 40 may output a DC voltage, or the like, obtained by integrating the sine wave oscillation signal OSC as the amplitude detection signal that is a voltage corresponding to the amplitude.

The power supply control circuit 50 is a circuit that controls the regulator 92. The power supply control circuit 50 may be implemented by an analog circuit, or may be implemented by an analog circuit and a digital circuit. For example, the power supply control circuit 50 controls the regulator 92 based on the amplitude detection signal from the amplitude detection circuit 40, such that the regulated power supply voltage VRGB becomes smaller than the amplitude of the oscillation signal OSC. Then, the regulator 92 supplies the regulated power supply voltage VRGB smaller than the amplitude of the oscillation signal OSC to the waveform shaping circuit 38, and the waveform shaping circuit 38 operates based on the supplied regulated power supply voltage VRGB to perform the waveform shaping on the oscillation signal OSC. The amplitude of the oscillation signal OSC can be defined by, for example, the peak voltage of the oscillation signal OSC. For example, the amplitude of the oscillation signal OSC can be defined by a peak voltage of the oscillation signal OSC on a high potential side and a peak voltage of the oscillation signal OSC on a low potential side. The regulated power supply voltage VRGB is, for example, a high-potential-side power supply voltage of the waveform shaping circuit 38, and specifically, a voltage corresponding to a potential difference between the high-potential-side power supply voltage and a low-potential-side power supply voltage. The low-potential-side power supply voltage is, for example, a GND voltage, which is a voltage of VSS.

As described above, in the embodiment, the amplitude of the oscillation signal OSC generated by the oscillation circuit 30 is detected, and the regulator 92 is controlled based on the amplitude detection signal as an amplitude detection result, such that the regulated power supply voltage VRGB becomes smaller than the amplitude of the oscillation signal OSC. Then, the regulated power supply voltage VRGB from the regulator 92 controlled in this manner is supplied to the waveform shaping circuit 38, and the waveform shaping is performed on the oscillation signal OSC. As described above, according to the embodiment, the amplitude of the oscillation signal OSC is detected, and the regulated power supply voltage VRGB smaller than the amplitude of the oscillation signal OSC can be reliably supplied to the waveform shaping circuit 38. Accordingly, a situation does not occur in which the oscillation signal OSC having the amplitude smaller than the regulated power supply voltage VRGB is subjected to the waveform shaping in the waveform shaping circuit 38. Therefore, a through current can be prevented from being generated during the waveform shaping, and power consumption of the waveform shaping circuit 38 can be reduced. In addition, it is possible to reduce phase noise of the clock signal CK after the waveform shaping, and the like. In the embodiment, the regulated power supply voltage VRGB is controlled based on an amplitude detection result of the oscillation signal OSC. Accordingly, even when the amplitude of the oscillation signal OSC fluctuates due to a change in a type (oscillation frequency) of a resonator 10, manufacturing variations of the resonator 10 or a circuit element, a temporal change in characteristics, an environmental fluctuation, or the like, the regulated power supply voltage VRGB also changes according to the fluctuating amplitude. For example, as the amplitude of the oscillation signal OSC increases, the regulated power supply voltage VRGB also increases, and as the amplitude of the oscillation signal OSC decreases, the regulated power supply voltage VRGB also decreases. Therefore, it becomes possible to implement appropriate control on the regulated power supply voltage VRGB according to the amplitude.

Figure 2:
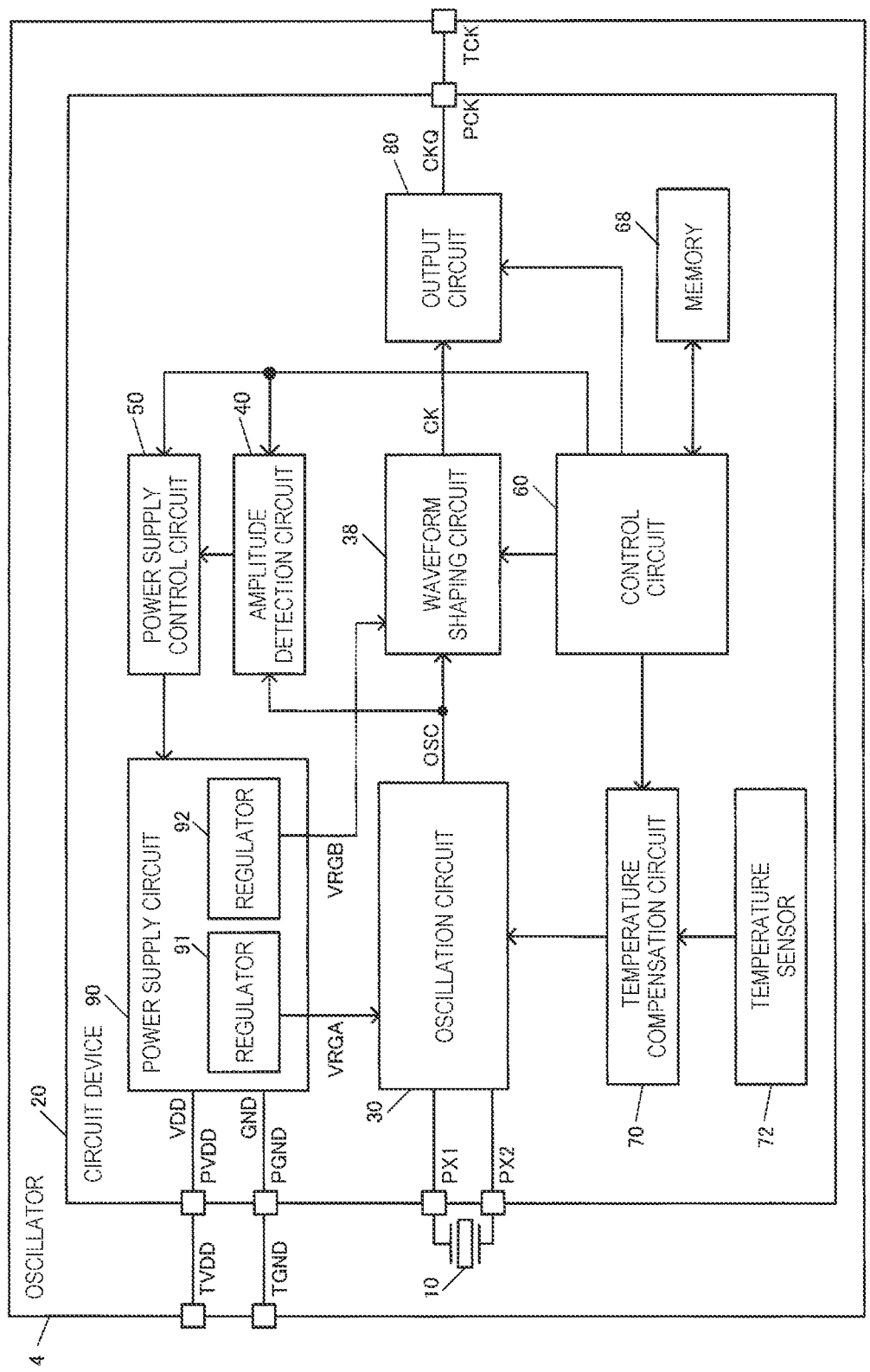
FIG. 2 shows a detailed configuration example of the circuit device and an oscillator according to the embodiment.

FIG. 2 shows a detailed configuration example of the circuit device 20 and an oscillator 4 including the circuit device 20 according to the embodiment. The oscillator 4 includes the resonator 10 and the circuit device 20. The resonator 10 is electrically coupled to the circuit device 20. For example, the resonator 10 and the circuit device 20 are electrically coupled using an internal wiring, a bonding wire, or a metal bump of a package that accommodates the resonator 10 and the circuit device 20. The circuit device 20 and the oscillator 4 are not limited to the configuration in FIG. 2, and various modifications can be made, such as omitting a part of components, adding other components, or replacing a part of components with other components.

The resonator 10 is an element that generates mechanical resonation by an electric signal. The resonator 10 can be implemented by a resonator element such as a quartz crystal resonator element. For example, the resonator 10 can be implemented by a quartz crystal resonator element that has a cut angle of AT cut or SC cut and that performs thickness-shear vibration, a tuning fork type quartz crystal resonator element, a double tuning fork type quartz crystal resonator element, or the like. For example, the resonator 10 may be a resonator built in a simple packaged crystal oscillator (SPXO), or may be a resonator built in a temperature compensated crystal oscillator (TCXO) having no thermostatic oven or a resonator built in an oven-controlled quartz crystal oscillator (OCXO) having a thermostatic oven. The resonator 10 according to the embodiment can also be implemented by various resonator elements such as a resonator element other than the thickness-shear vibrating type, the tuning fork type or the double tuning fork type resonator element, or a piezoelectric resonator element made of a material other than quartz crystal. For example, a surface acoustic wave (SAW) resonator, or a micro electro mechanical systems (MEMS) resonator as a silicon resonator formed using a silicon substrate may be adopted as the resonator 10.

The circuit device 20 is an integrated circuit device referred to as an integrated circuit (IC). For example, the circuit device 20 is an IC manufactured by a semiconductor process and is a semiconductor chip in which a circuit element is formed at a semiconductor substrate. The circuit device 20 includes pads PVDD, PGND, PX1, PX2, and PCK. A pad for output enable control of the clock signal or the like may be provided. The pads are terminals of the circuit device 20 which is the semiconductor chip. For example, in a pad area, a metal layer is exposed from a passivation film that is an insulating layer, and the exposed metal layer constitutes the pad that is the terminal of the circuit device 20. The pads PVDD and PGND are a power supply pad and a ground pad, respectively. A power supply voltage VDD from an external power supply device is supplied to the pad PVDD. The pad PGND is a pad to which GND, which is a ground voltage, is supplied. GND can also be referred to as VSS, and the ground voltage is, for example, a ground potential. In the embodiment, the ground is referred to as GND as appropriate. For example, VDD corresponds to a high-potential-side power supply voltage, and GND corresponds to a low-potential-side power supply voltage. The pads PX1 and PX2 are pads for coupling to the resonator 10. The pad PCK is a pad for outputting an output clock signal CKQ. The pads PVDD, PGND, and PCK are electrically coupled to terminals TVDD, TGND, and TCK, respectively, which are external terminals for external coupling of the oscillator 4. For example, the pads and the terminals are electrically coupled using an internal wiring, a bonding wire, or a metal bump of a package.

The oscillation circuit 30 is a circuit that oscillates the resonator 10. For example, the oscillation circuit 30 generates the oscillation signal OSC by oscillating the resonator 10. For example, the oscillation circuit 30 can be implemented by an oscillation drive circuit electrically coupled to one end and the other end of the resonator 10 and a passive element such as a capacitor or a resistor. The drive circuit can be implemented by, for example, a bipolar transistor or a CMOS inverter circuit. The drive circuit is a core circuit of the oscillation circuit 30. The drive circuit drives the resonator 10 by a voltage or a current to oscillate the resonator 10. As the oscillation circuit 30, various types of oscillation circuits such as an inverter type, a Pierce type, a Colpitts type, or a Hartley type oscillation circuit can be used. The oscillation circuit 30 is electrically coupled to the resonator 10 via the pads PX1 and PX2. The pads PX1 and PX2 are pads for coupling to the resonator. An oscillation drive circuit 34 of the oscillation circuit 30 is provided between the pad PX1 and the pad PX2. The oscillation circuit 30 may include a variable capacitance circuit (not shown). The variable capacitance circuit is, for example, a circuit that changes a capacitance of at least one of one end and the other end of the resonator 10, and an oscillation frequency of the oscillation circuit 30 can be adjusted by adjusting the capacitance of the variable capacitance circuit. That is, by electrically coupling the variable capacitance circuit to at least one of the pads PX1 and PX2, a load capacitance of the oscillation circuit 30 can be variably adjusted. The variable capacitance circuit can be implemented by a variable capacitance element such as a varactor. For example, the variable capacitance circuit includes at least one variable capacitance element. The coupling in the embodiment is electrical coupling. The electrical coupling is coupling in which an electrical signal can be transmitted and information can be transmitted by the electrical signal. The electrical coupling may be coupling via a passive element and the like.

A control circuit 60 is a logic circuit and performs various types of control processes. For example, the control circuit 60 controls the entire circuit device 20 or controls an operation sequence of the circuit device 20. In addition, the control circuit 60 may control the oscillation circuit 30, the waveform shaping circuit 38, the amplitude detection circuit 40, the power supply control circuit 50, a temperature compensation circuit 70, a power supply circuit 90, a memory 68, or the like. The control circuit 60 can be implemented by a circuit of an application specific integrated circuit (ASIC) based on automatic placement and wiring such as a gate array.

The memory 68 stores various types of information used in the circuit device 20. The memory 68 is, for example, a nonvolatile memory. Although the nonvolatile memory is an EEPROM such as a floating gate avalanche injection MOS (FAMOS) memory or a metal-oxide-nitride-oxide-silicon (MONOS) memory, the nonvolatile memory is not limited thereto and may be a one time programmable (OTP) memory, a fuse ROM, or the like. Alternatively, the memory 68 may be implemented by a volatile memory such as a RAM.

The temperature compensation circuit 70 performs temperature compensation on the oscillation frequency of the oscillation circuit 30. The temperature compensation is a process of preventing and compensating a fluctuation of the oscillation frequency due to a temperature fluctuation. Specifically, the temperature compensation circuit 70 performs the temperature compensation based on a temperature detection signal from a temperature sensor 72. For example, the temperature compensation circuit 70 generates a temperature compensation voltage based on a temperature detection voltage from the temperature sensor 72, and outputs the generated temperature compensation voltage to the variable capacitance circuit provided in the oscillation circuit 30, thereby performing the temperature compensation. In this case, the variable capacitance circuit of the oscillation circuit 30 is implemented by a variable capacitance element such as a varactor. For example, when the temperature compensation voltage for compensating frequency-temperature characteristics of the resonator 10 is approximated by a polynomial, the temperature compensation circuit 70 performs the temperature compensation in an analog manner based on coefficient information of the polynomial. Alternatively, the temperature compensation circuit 70 may perform the temperature compensation in a digital manner. In this case, the variable capacitance circuit can be implemented by, for example, a capacitor array and a switch array coupled to the capacitor array, and the temperature compensation circuit 70 can be implemented by, for example, a logic circuit.

The temperature sensor 72 is a sensor that detects a temperature. Specifically, the temperature sensor 72 outputs, as a temperature detection voltage, a temperature-dependent voltage that changes according to a temperature of an environment. Specifically, the temperature sensor 72 outputs the temperature detection voltage whose voltage changes depending on the temperature using, for example, temperature dependence of a forward voltage of a PN junction. A modification using a temperature sensor circuit in the digital manner as the temperature sensor 72 can also be adopted. In this case, temperature detection data may be subjected to D/A conversion to generate the temperature detection voltage.

An output circuit 80 buffers and outputs the clock signal CK generated based on the oscillation signal OSC. For example, the output circuit 80 buffers the clock signal CK and outputs the buffered clock signal CK as the output clock signal CKQ to the pad PCK. For example, the output circuit 80 outputs the output clock signal CKQ in a single-ended CMOS signal format. Alternatively, the output circuit 80 outputs a differential clock signal in a signal format such as low voltage differential signaling (LVDS), positive emitter coupled logic (PECL), high speed current steering logic (HCSL), or differential complementary MOS (CMOS). A PLL circuit that multiplies a frequency of the clock signal CK may be provided between the oscillation circuit 30 or the waveform shaping circuit 38 and the output circuit 80. In this manner, the output circuit 80 can output the output clock signal CKQ having a frequency obtained by multiplying the oscillation frequency.

The power supply circuit 90 is supplied with the power supply voltage VDD from the pad PVDD and the ground voltage GND from the pad PGND, and supplies various power supply voltages for an internal circuit of the circuit device 20 to the internal circuit. For example, the power supply circuit 90 generates regulated power supply voltages VRGA and VRGB obtained by regulating the power supply voltage VDD. For example, a regulator 91 of the power supply circuit 90 generates the regulated power supply voltage VRGA, and the regulator 92 generates the regulated power supply voltage VRGB. Then, the regulated power supply voltage VRGA is supplied to the oscillation circuit 30, and the oscillation circuit 30 performs an oscillation operation of driving the resonator 10 based on the regulated power supply voltage VRGA and generating the oscillation signal OSC. The waveform shaping circuit 38 performs the waveform shaping on the oscillation signal OSC based on the regulated power supply voltage VRGB, and outputs the clock signal CK after the waveform shaping. The power supply circuit 90 can also generate a regulated power supply voltage to be supplied to the control circuit 60, the memory 68, the temperature compensation circuit 70, the temperature sensor 72, or the like.

Then, in FIG. 2, the amplitude detection circuit 40 detects the amplitude of the oscillation signal OSC from the oscillation circuit 30, and the power supply control circuit 50 controls the power supply circuit 90 based on an amplitude detection result. Accordingly, the regulator 92 of the power supply circuit 90 supplies the regulated power supply voltage VRGB smaller than the amplitude of the oscillation signal OSC to the waveform shaping circuit 38, and the waveform shaping circuit 38 operates based on the supplied regulated power supply voltage VRGB to perform the waveform shaping on the oscillation signal OSC, thereby outputting the clock signal CK subjected to the waveform shaping.

Figure 3:
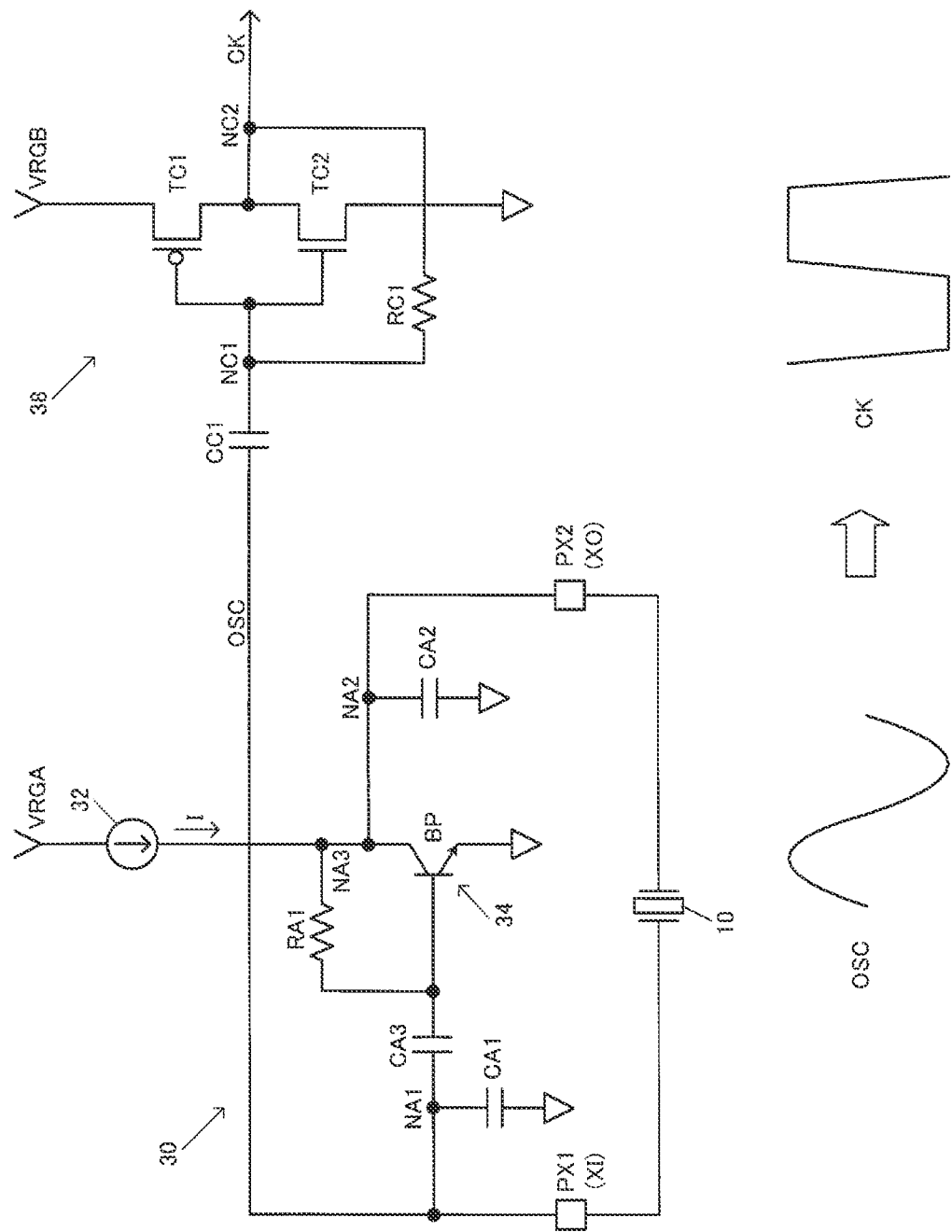
FIG. 3 shows a configuration example of the oscillation circuit and a waveform shaping circuit.

FIG. 3 shows a configuration example of the oscillation circuit 30 and the waveform shaping circuit 38. The oscillation circuit 30 includes a current source 32 and the drive circuit 34. The oscillation circuit 30 may include capacitance circuits CA1 and CA2.

The current source 32 and the drive circuit 34 are provided in series between a VRGA power supply node, which is a high-potential-side power supply node, and a GND node, which is a low-potential-side power supply node. The capacitance circuit CA1 is provided between a node NA1 on a pad PX1 side to which one end of the resonator 10 is coupled and the GND node. The capacitance circuit CA2 is provided between a node NA2 on a pad PX2 side to which the other end of the resonator 10 is coupled and the GND node. The capacitance circuits CA1 and CA2 are, for example, the variable capacitance circuits. By adjusting capacitances of the capacitance circuits CA1 and CA2, the oscillation frequency is adjusted, and a process of the temperature compensation performed on the oscillation frequency is implemented.

The drive circuit 34 includes a bipolar transistor BP. A collector of the bipolar transistor BP is coupled to a node NA3 which is a supply node of a current I of the current source 32, and an emitter is coupled to the GND node. A resistor RA1 is provided between the collector and a base. A capacitor CA3 is provided between the base of the bipolar transistor BP and the node NA1.

The current source 32 can be implemented by, for example, a current mirror circuit. The current mirror circuit supplies, to the drive circuit 34, the current I obtained by current-mirroring a reference current from a reference current generation circuit (not shown). The drive circuit 34 drives the resonator 10 based on the current I from the current source 32.

The waveform shaping circuit 38 includes a P-type transistor TC1 and an N-type transistor TC2 that are provided in series between a VRGB power supply node, which is the high-potential-side power supply node, and the GND node. A node NC1, which is a gate node of the transistors TC1 and TC2, and a node NC2, which is a drain node of the transistors TC1 and TC2, are coupled via a resistor RC1. The waveform shaping circuit 38 includes a capacitor CC1 provided between an input node of the oscillation signal OSC and the node NC1. By providing the capacitor CC1, the oscillation signal OSC from which DC component is cut is input to the node NC1. In this manner, by coupling the input node NC1 and the output node NC2 via the resistor RC1 and providing the DC-cut capacitor CC1, the waveform shaping can be performed on the oscillation signal OSC by self-bias. That is, by feeding back a voltage of the node NC2 to the node NC1 via the resistor RC1, a bias voltage of the oscillation signal OSC from which the DC component is cut is set, and the waveform shaping is performed on the sine wave oscillation signal OSC to obtain the rectangular wave clock signal CK with a voltage corresponding to the bias voltage as a threshold voltage. FIG. 3 shows a case where the waveform shaping circuit 38 is implemented by a one-stage buffer circuit including the transistors TC1 and TC2. Alternatively, the waveform shaping circuit 38 can be implemented by a multiple-stage buffer circuit. Further, the bias voltage of the oscillation signal OSC at the node NC1 is set by the self-bias in FIG. 3. Alternatively, a bias voltage setting circuit may be separately provided, and a bias voltage corresponding to an amplitude center voltage of the oscillation signal OSC may be set by the bias voltage setting circuit.

Figure 4:
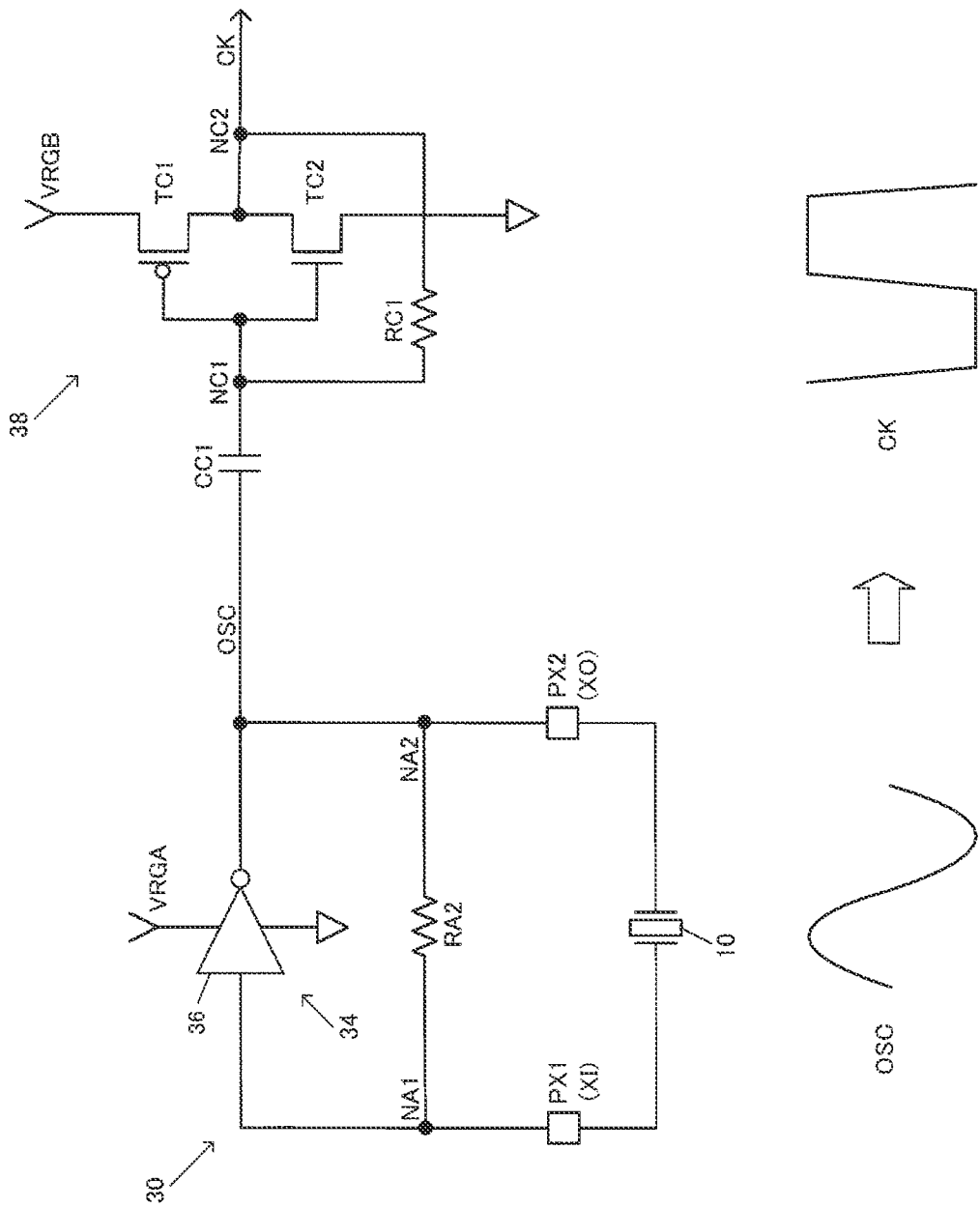
FIG. 4 shows another configuration example of the oscillation circuit.

FIG. 4 shows another configuration example of the oscillation circuit 30. In FIG. 4, the drive circuit 34 of the oscillation circuit 30 includes a CMOS buffer circuit 36. The buffer circuit 36 includes, for example, a P-type transistor and an N-type transistor that are coupled in series between the VRGA power supply node and the GND node. A feedback resistor RA2 is provided between the input node NA1 of the buffer circuit 36 and the output node NA2 of the buffer circuit 36. The buffer circuit 36 having such a configuration drives the resonator 10, so that it is possible to oscillate the resonator 10 and generate the oscillation signal OSC.

2. Setting of Regulated Power Supply Voltage Based on Amplitude Detection

Figure 5:
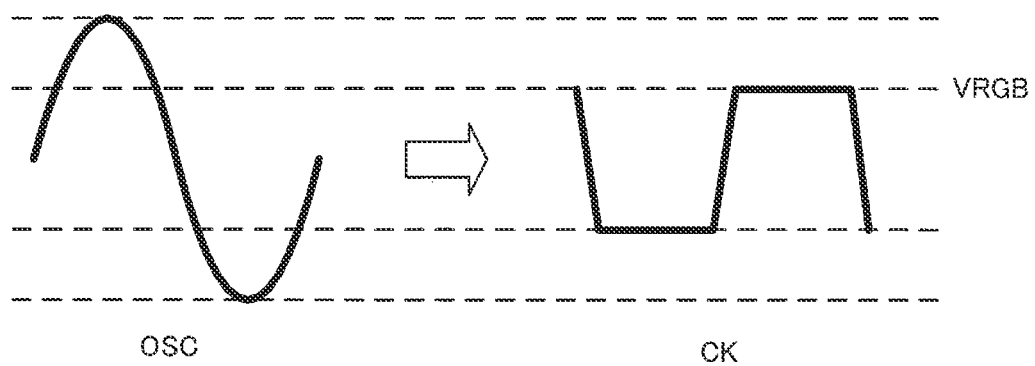
FIG. 5 is a diagram showing a method according to the embodiment.

In the embodiment, a method is adopted in which the amplitude of the oscillation signal OSC is detected to automatically control the regulated power supply voltage VRGB of the waveform shaping circuit 38. That is, the amplitude detection circuit 40 detects the amplitude of the oscillation signal OSC. Based on the amplitude detection result, as shown in FIG. 5, the regulated power supply voltage VRGB supplied to the waveform shaping circuit 38 is controlled to be smaller than the amplitude of the oscillation signal OSC. For example, the power supply control circuit 50 controls the regulator 92 based on the amplitude detection signal from the amplitude detection circuit 40, such that the regulated power supply voltage VRGB becomes smaller than the amplitude of the oscillation signal OSC. In FIG. 5, the amplitude of the oscillation signal OSC is defined by, for example, the peak voltages of the oscillation signal OSC, and is defined by, for example, the peak voltage on the high potential side and the peak voltage on the low potential side. The regulated power supply voltage VRGB corresponding to the potential difference between the high-potential-side power supply voltage and the low-potential-side power supply voltage of the waveform shaping circuit 38 is smaller than the amplitude of the oscillation signal OSC. Specifically, the regulator 92 is provided with a resistance division circuit for setting a voltage level of the regulated power supply voltage VRGB. Then, the power supply control circuit 50 controls a resistance ratio in the resistance division circuit, thereby implementing control of making the regulated power supply voltage VRGB smaller than the amplitude of the oscillation signal OSC. The oscillation signal OSC in FIG. 5 is the oscillation signal OSC at the node NC1 of the waveform shaping circuit 38 in FIG. 3, and is a sine wave signal in which the DC component is cut by the capacitor CC1 and the amplitude center voltage of the oscillation signal OSC is set to the bias voltage. In the example in FIG. 3, a self-bias voltage is set by feeding back the signal of the node NC2 to the node NC1 through the resistor RC1. The oscillation signal OSC at the node NC1 shown in FIG. 5 is a sine wave signal whose amplitude center voltage is the bias voltage. As shown in FIG. 5, the regulated power supply voltage VRGB, which is the high-potential-side power supply voltage of the waveform shaping circuit 38, is lower than the peak voltage of the oscillation signal OSC on the high potential side. The peak voltage of the oscillation signal OSC on the low potential side is lower than the low-potential-side power supply voltage of the waveform shaping circuit 38.

For example, the amplitude of the oscillation signal OSC changes according to the type of the resonator 10. For example, when one type of circuit device 20 is shared by a plurality of types of resonators 10 having different oscillation frequencies or the like, the amplitude of the oscillation signal OSC also changes according to the type of the resonator 10 packaged together with the circuit device 20. Further, a CI value of the resonator 10 fluctuates due to manufacturing variations or the like. The CI value corresponds to a series resistance component when the resonator 10 at the time of oscillation is expressed by an equivalent circuit, and is an equivalent resistance value in a series resonance frequency. When the CI value increases, the amplitude of the oscillation signal OSC of the resonator 10 decreases. That is, the amplitude of the oscillation signal OSC fluctuates due to manufacturing variations of the resonator 10 or the like. In addition, the oscillation circuit 30 has a load capacitance due to the above-described variable capacitance circuit or the like, and when the load capacitance of the oscillation circuit 30 fluctuates, the amplitude of the oscillation signal OSC also fluctuates. In addition, the amplitude of the oscillation signal OSC also fluctuates due to an environmental temperature and a temporal change. For example, in JP-A-2003-046338 described above, a power supply voltage of a buffer stage inverter is set without considering such a fluctuation of the amplitude of the oscillation signal OSC at all. In contrast, in the embodiment, the amplitude detection circuit 40 detects the amplitude of the oscillation signal OSC, and controls the regulated power supply voltage VRGB of the waveform shaping circuit 38 based on the amplitude detection result.

Figure 6:
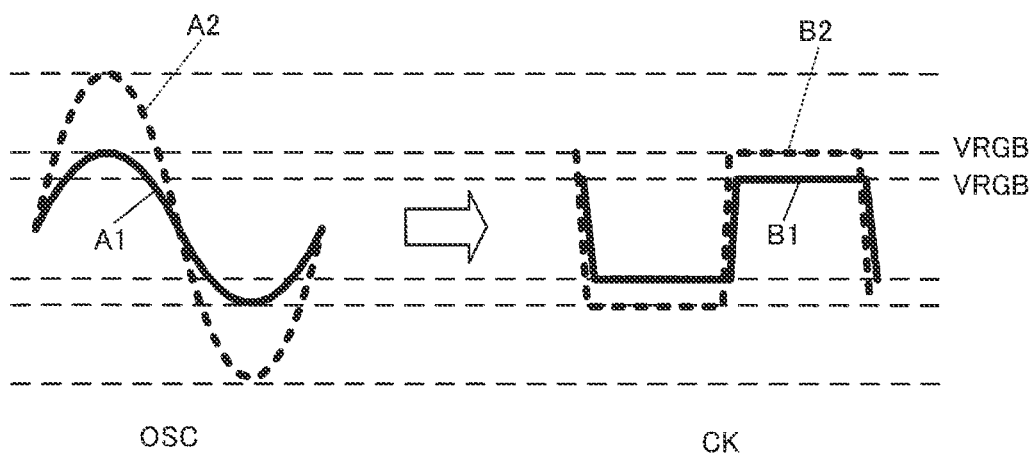
FIG. 6 is a diagram showing a method according to the embodiment.

For example, in A1 of FIG. 6, the amplitude of the oscillation signal OSC is small, and in this case, as indicated by B1, the regulated power supply voltage VRGB is set to a voltage corresponding to the small amplitude. In A2 of FIG. 6, the amplitude of the oscillation signal OSC is large, and in this case, as indicated by B2, the regulated power supply voltage VRGB is set to a voltage corresponding to the large amplitude. In both cases B1 and B2, the regulator 92 is controlled, such that the regulated power supply voltage VRGB becomes smaller than the amplitude of the oscillation signal OSC.

Figure 7:
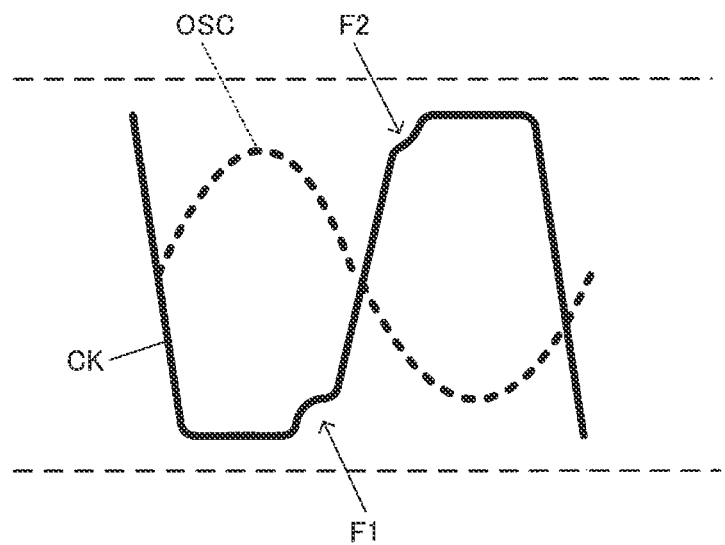
FIG. 7 is a diagram showing a problem in the waveform shaping circuit.

FIG. 7 is a waveform example of the clock signal CK when the regulated power supply voltage VRGB supplied to the waveform shaping circuit 38 is larger than the amplitude of the oscillation signal OSC. When the regulated power supply voltage VRGB is larger than the amplitude in this manner, both the P-type transistor TC1 and the N-type transistor TC2 of the waveform shaping circuit 38 in FIG. 3 are turned on, a period in which the through current is generated becomes longer, and the through current increases. When the through current increases, current consumption of the waveform shaping circuit 38 increases, which obstructs a reduction of power consumption of the circuit device 20. Further, when a signal level of the clock signal CK transitions due to a voltage level of the oscillation signal OSC, due to the presence of a period during which both the P-type transistor TC1 and the N-type transistor TC2 are in the ON-state, waveform distortion as indicated by F1 and F2 in FIG. 7 also occurs.

Figure 8:
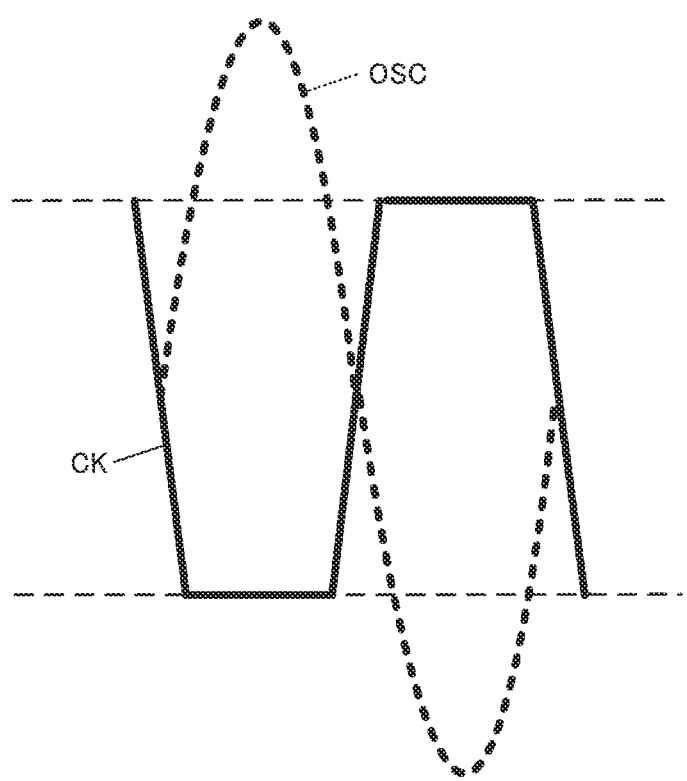
FIG. 8 is a diagram showing a method according to the embodiment.

FIG. 8 is an example of a case where the method according to the embodiment is applied, and is a waveform example of the clock signal CK when the regulated power supply voltage VRGB supplied to the waveform shaping circuit 38 is smaller than the amplitude of the oscillation signal OSC. By making the regulated power supply voltage VRGB smaller than the amplitude of the oscillation signal OSC in this manner, it is possible to fairly shorten the period during which both the P-type transistor TC1 and the N-type transistor TC2 of the waveform shaping circuit 38 are turned on, and it is possible to reduce the through current to a minimum limit. Accordingly, the current consumption of the waveform shaping circuit 38 can be reduced, and the power consumption of the circuit device 20 can be reduced. In addition, since the period is fairly short during which both the transistors TC1 and TC2 are turned on, it is possible to prevent the occurrence of the waveform distortion as indicated by F1 and F2 in FIG. 7.

Figure 9:
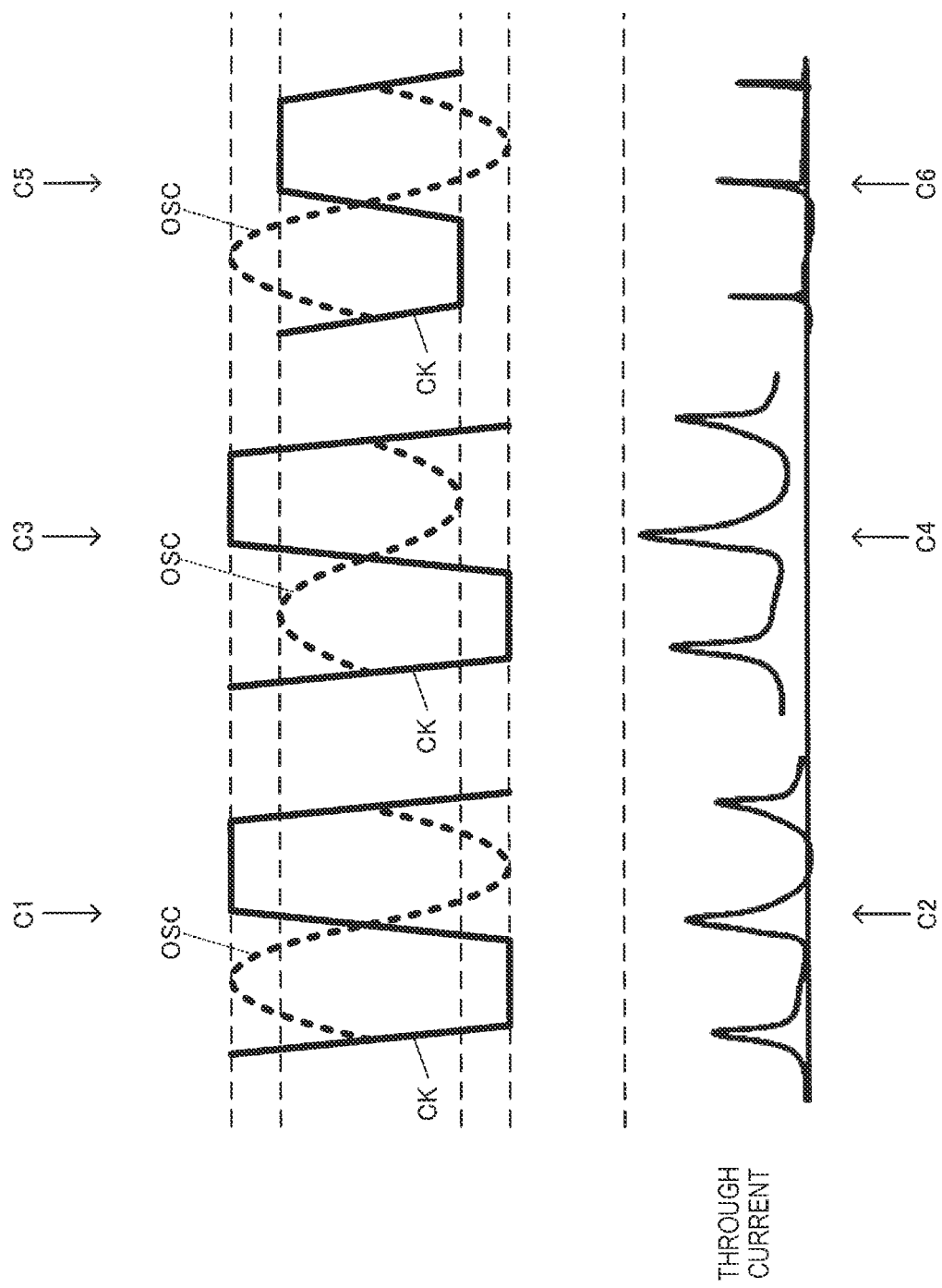
FIG. 9 is a diagram showing a through current in the waveform shaping circuit.

FIG. 9 is a diagram showing a through current in the waveform shaping circuit 38. C1 and C2 in FIG. 9 show through currents when the amplitude of the oscillation signal OSC is equal to the regulated power supply voltage VRGB, and C3 and C4 show through currents when the regulated power supply voltage VRGB is larger than the amplitude of the oscillation signal OSC. In this case, as indicated by C2 and C4, the through currents caused by turning on both the transistors TC1 and TC2 become fairly large.

On the other hand, C5 and C6 in FIG. 9 show through currents when the regulated power supply voltage VRGB is smaller than the amplitude of the oscillation signal OSC. In this case, as indicated by C6, the through current becomes fairly small as compared with C2 and C4. Accordingly, the power consumption of the waveform shaping circuit 38 can be reduced as compared with the cases of C2 and C4.

The regulator 92 regulates the power supply voltage VDD to generate the regulated power supply voltage VRGB. By providing such a regulator 92, the regulated power supply voltage VRGB from which power supply noise such as ripple of the power supply voltage VDD is removed can be generated and supplied to the waveform shaping circuit 38. However, when the through current at the time of the signal transition becomes large as indicated by C2 and C4 in FIG. 9, a current supply capacity of the regulator 92 is exceeded, the regulator 92 cannot completely remove the power supply noise, and a power supply rejection ratio (PSRR) which is a power supply voltage fluctuation removal ratio deteriorates.

In this regard, in the embodiment, by making the regulated power supply voltage VRGB smaller than the amplitude of the oscillation signal OSC as indicated by C5, the through current at the time of the signal transition is reduced as indicated by C6. Accordingly, it is possible to prevent the occurrence of the situation in which the through current exceeds the current supply capacity of the regulator 92 and the power supply noise cannot be completely removed, and it is possible to prevent the deterioration of the PSRR.

Figure 10:
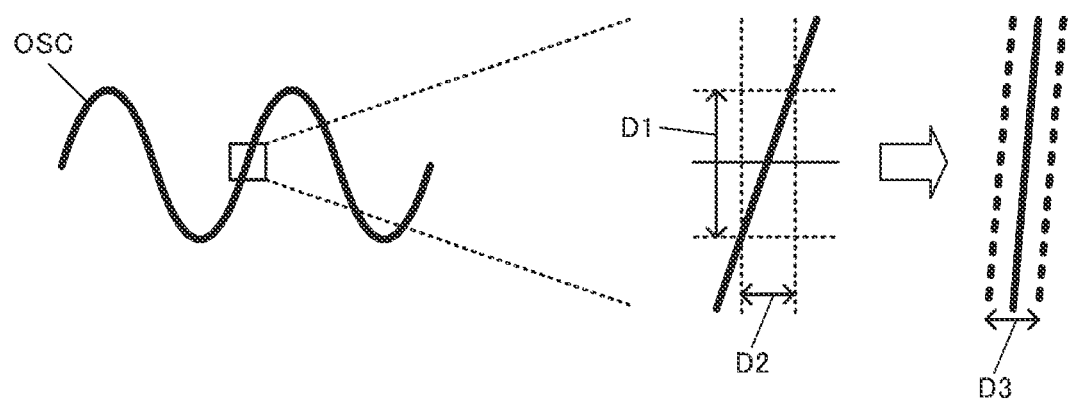
FIG. 10 is a diagram showing deterioration of phase noise.

FIG. 10 is a diagram showing deterioration of the phase noise of the clock signal CK when the regulated power supply voltage VRGB is larger than the amplitude of the oscillation signal OSC. When the regulated power supply voltage VRGB becomes larger than the amplitude, a threshold fluctuation at the time of the waveform shaping performed by the waveform shaping circuit 38 becomes large as indicated by D1 in FIG. 10. Due to this threshold fluctuation, a temporal fluctuation of a transition timing of the clock signal CK at the time of the waveform shaping also increases as indicated by D2. Accordingly, as indicated by D3, a phase fluctuation of the clock signal CK after the waveform shaping becomes large, and the phase noise of the clock signal CK becomes large.

Figure 11:
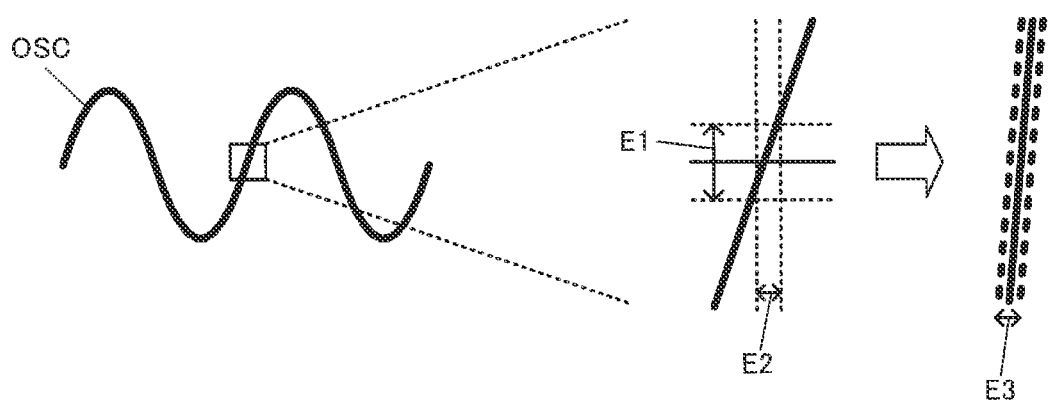
FIG. 11 is a diagram showing the phase noise in the embodiment.

FIG. 11 is a diagram showing phase noise in the method according to the embodiment in which the regulated power supply voltage VRGB is smaller than the amplitude of the oscillation signal OSC. When the regulated power supply voltage VRGB becomes smaller than the amplitude, as indicated by E1 in FIG. 11, the threshold fluctuation at the time of waveform shaping can be made small as compared with D1 in FIG. 10. Accordingly, as indicated by E2 in FIG. 11, the temporal fluctuation of the transition timing of the clock signal CK at the time of waveform shaping becomes small as compared with D2 in FIG. 10. Accordingly, as indicated by E3 in FIG. 11, the phase fluctuation of the clock signal CK after the waveform shaping becomes small as compared with D3 in FIG. 10, and the phase noise of the clock signal CK can be reduced.

3. Amplitude Detection Circuit and Power Supply Control Circuit

Figure 12:
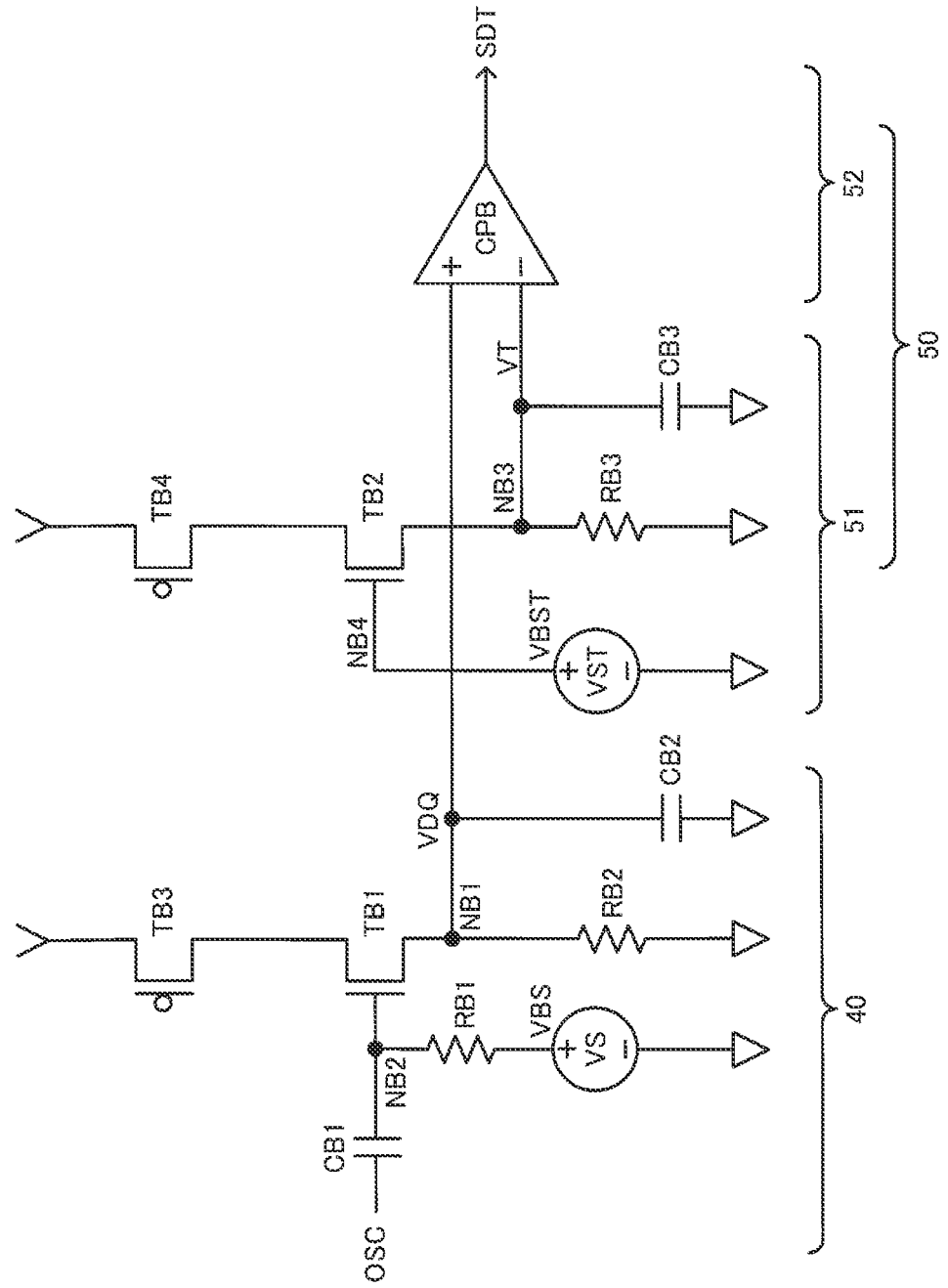
FIG. 12 shows a configuration example of an amplitude detection circuit and a power supply control circuit.

FIG. 12 shows a configuration example of the amplitude detection circuit 40 and the power supply control circuit 50. Although various configuration examples of the amplitude detection circuit 40 and the power supply control circuit 50 will be described below, the embodiment is not limited thereto, and various modifications can be made such as omitting a part of the components, adding other components, or replacing a part of the components with other components.

The amplitude detection circuit 40 includes transistors TB1 and TB3, resistors RB1 and RB2, a voltage source VS, and capacitors CB1 and CB2. The transistors TB1 and TB3 and the resistor RB2 are provided in series between a power supply node and the GND node. The resistor RB2 and the capacitor CB2 are provided in parallel between a node NB1 of a drain of the transistor TB1 and the GND node. The transistor TB1 is an N-type transistor, and has an open-drain coupling configuration. During the operation of the amplitude detection circuit 40, the P-type transistor TB3 is turned on.

The capacitor CB1 is provided between the input node of the oscillation signal OSC and a node NB2 of a gate of the transistor TB1. The resistor RB1 and the voltage source VS are provided in series between the node NB2 and the GND node. The capacitor CB1 is a DC-cut capacitor, and the capacitor CB1 cuts the DC component of the oscillation signal OSC and transmits an AC component to the node NB2. The voltage source VS sets a bias voltage corresponding to the amplitude center voltage of the oscillation signal OSC from which the DC component is cut. The capacitor CB2 for holding a voltage is provided at the node NB1, and a capacity of a discharge current according to a time constant of CR by the capacitor CB2 and the resistor RB2 is sufficiently smaller than a current supply capacity of the transistor TB1. Accordingly, the peak voltage of the oscillation signal OSC is held at the node NB1 of the drain of transistor TB1, an envelope of oscillation signal OSC is detected, and an output voltage VDQ corresponding to the peak voltage is output from the amplitude detection circuit 40 as the amplitude detection signal.

Figure 18:
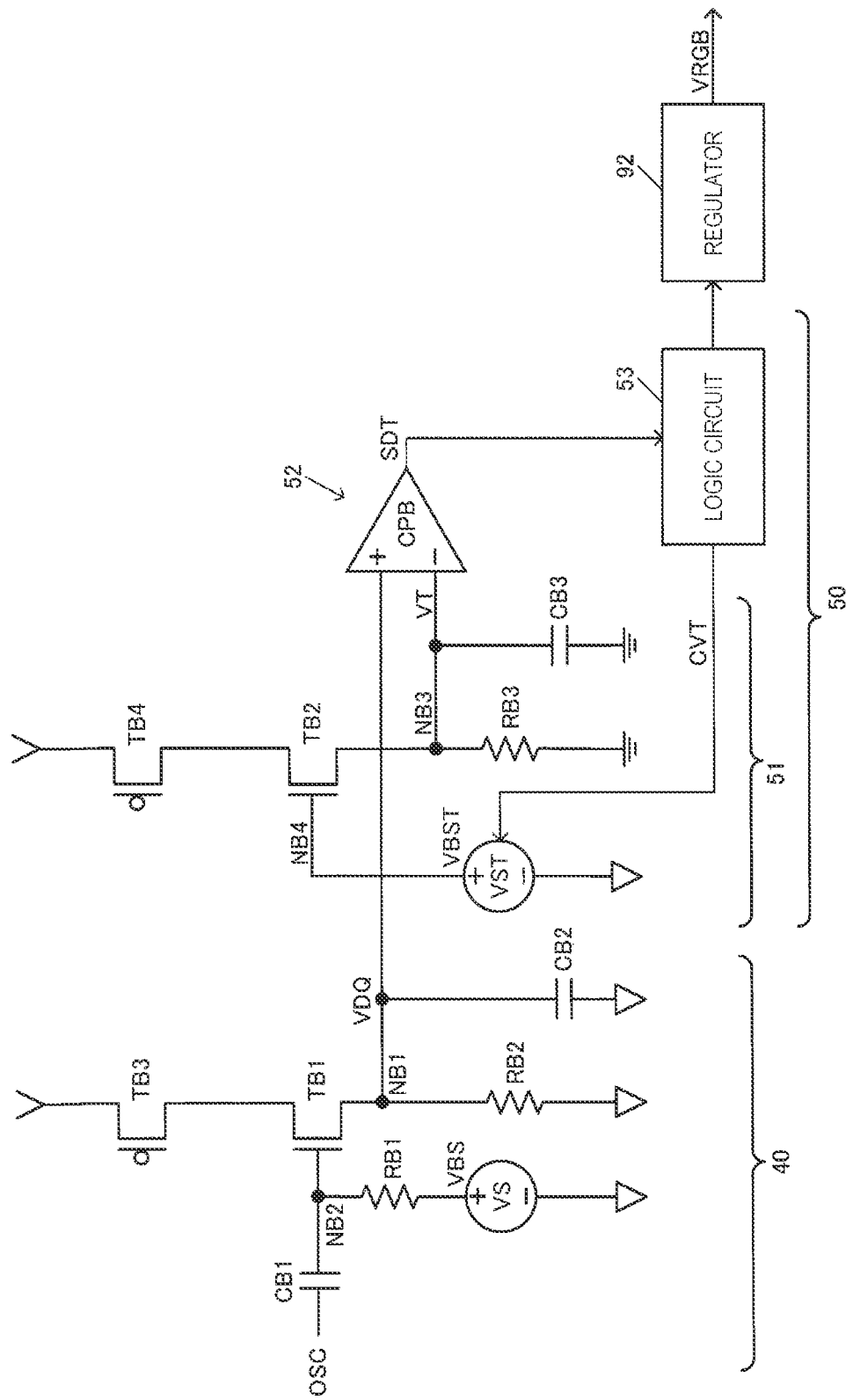
FIG. 18 shows a detailed configuration example of the power supply control circuit.

The power supply control circuit 50 includes a voltage generation circuit 51 and a comparison circuit 52. As shown in FIG. 18 to be described later, the power supply control circuit 50 may include a logic circuit 53. The voltage generation circuit 51 generates a variable threshold voltage VT. The comparison circuit 52 compares the output voltage VDQ, which is the amplitude detection signal of the amplitude detection circuit 40, with the threshold voltage VT, and outputs a detection signal SDT as a comparison result. The output voltage VDQ is the voltage corresponding to the amplitude of the oscillation signal OSC, and is, for example, the peak voltage of the oscillation signal OSC. Then, taking FIG. 18 to be described later as an example, the logic circuit 53 sets the regulated power supply voltage VRGB of the regulator 92 based on the detection signal SDT which is the comparison result of the comparison circuit 52. That is, the logic circuit 53 sets the regulated power supply voltage VRGB to a voltage smaller than the amplitude of the oscillation signal OSC in the waveform shaping circuit 38.

The voltage generation circuit 51 includes transistors TB2 and TB4, a resistor RB3, a voltage source VST, and a capacitor CB3. The comparison circuit 52 includes a comparator CPB. The transistors TB2 and TB4 and the resistor RB3 are provided in series between the power supply node and the GND node. The resistor RB3 and the capacitor CB3 are provided in parallel between a node NB3 of a drain of the transistor TB2 and the GND node. The transistor TB2 is an N-type transistor, and has the open-drain coupling configuration. During the operation of the power supply control circuit 50, the P-type transistor TB4 is turned on. The voltage source VST is provided between a node NB4 of a gate of the transistor TB2 and the GND node. As described above, the voltage generation circuit 51 has a replica configuration equivalent to that of the amplitude detection circuit 40, and has a configuration in which symmetry of the circuit is maintained. Then, a bias voltage VBST is set to the node NB4 by the voltage source VST. Here, the voltage source VST generates the variable bias voltage VBST, so that the threshold voltage VT generated based on the bias voltage VBST becomes a variable voltage. The threshold voltage VT based on the bias voltage VBST is input to an inverting input terminal, which is a first input terminal of the comparator CPB of the comparison circuit 52, and the output voltage VDQ of the amplitude detection circuit 40 is input to a non-inverting input terminal, which is a second input terminal of the comparator CPB. That is, a voltage corresponding to the amplitude of the oscillation signal OSC is input to the non-inverting input terminal of the comparator CPB. When the output voltage VDQ exceeds the threshold voltage VT, the comparator CPB sets the detection signal SDT to an active level. The logic circuit 53 in FIG. 18 controls the regulator 92 based on the detection signal SDT, thereby controlling the regulated power supply voltage VRGB to be smaller than the amplitude of the oscillation signal OSC.

Figure 13:
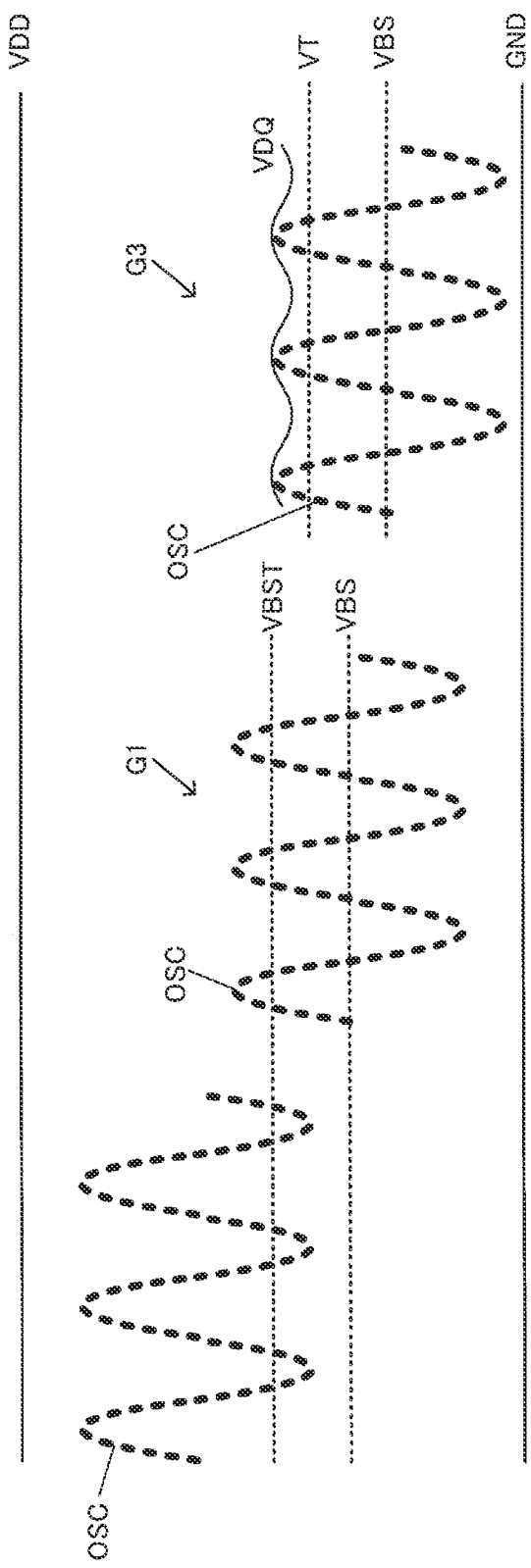
FIG. 13 is a diagram showing operations of the amplitude detection circuit and the power supply control circuit.
Figure 14:
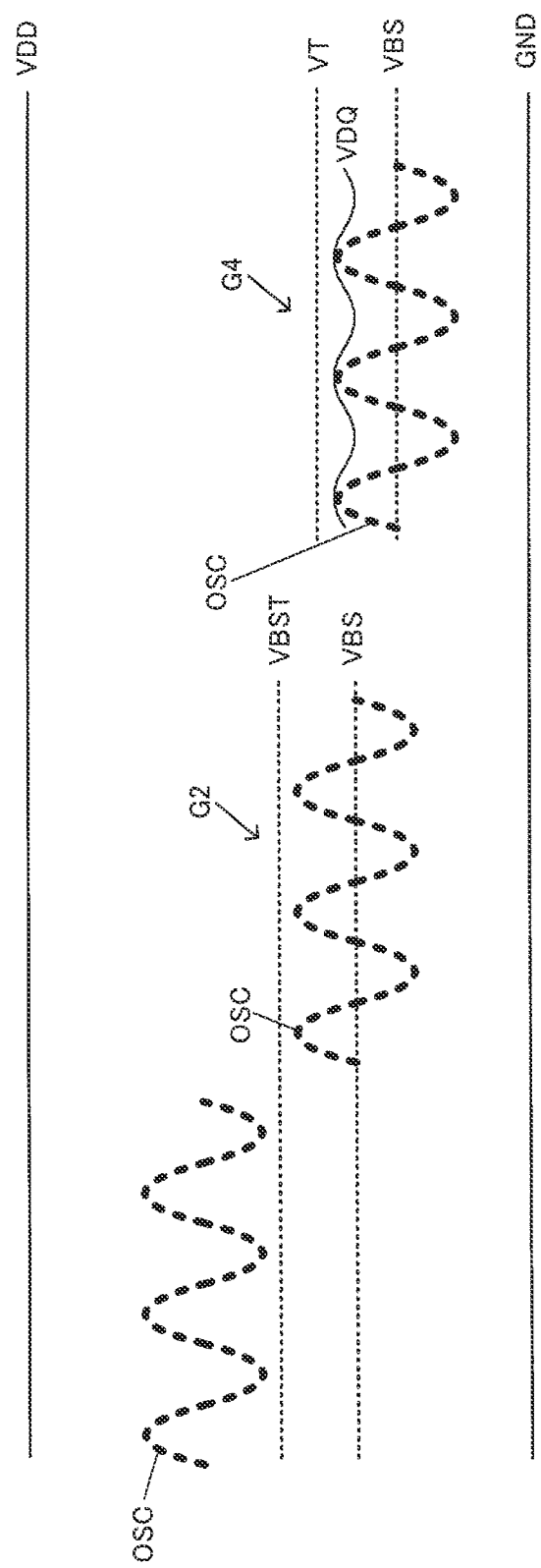
FIG. 14 is a diagram showing operations of the amplitude detection circuit and the power supply control circuit.

FIGS. 13 and 14 are diagrams showing operations of the amplitude detection circuit 40 and the power supply control circuit 50. The oscillation signal OSC becomes a sine wave signal having the bias voltage VBST as the amplitude center voltage as indicated by G1 and G2 in FIGS. 13 and 14 by the capacitor CB1 cutting the DC component in FIG. 12 and the voltage source VS of the amplitude detection circuit 40 setting the bias voltage. The bias voltage VBST generated by the voltage source VST of the power supply control circuit 50 is set to voltages as indicated by G1 and G2 for the oscillation signal OSC. When the envelope of the oscillation signal OSC is detected, the output voltage VDQ as indicated by G3 and G4 in FIGS. 13 and 14 is output from the amplitude detection circuit 40. Here, since the N-type transistor TB1 is in opened-ray coupling, the voltage of the oscillation signal OSC and the bias voltage VBS in G3 and G4 are low as compared with G1 and G2 by the threshold voltage of the transistor TB1. The threshold voltage VT set by the bias voltage VBST of the voltage source VST is also a voltage obtained by lowering the bias voltage VBST by the threshold voltage of the open-drain coupling transistor TB2 in G3 and G4 as compared with G1 and G2.

In G3 of FIG. 13, the output voltage VDQ of the amplitude detection circuit 40 exceeds the threshold voltage VT generated by the voltage generation circuit 51, resulting in VDQ>VT. Therefore, the comparison circuit 52 outputs the detection signal SDT at the active level, for example, a high level. On the other hand, in G4 of FIG. 14, the output voltage VDQ of the amplitude detection circuit 40 is lower than the threshold voltage VT, resulting in VDQ<VT. Therefore, the comparison circuit 52 outputs the detection signal SDT at a low level which is an inactive level.

As described above, in FIGS. 12 to 14, the amplitude detection circuit 40 outputs the output voltage VDQ as the amplitude detection signal, and the power supply control circuit 50 compares the output voltage VDQ with the threshold voltage VT to determine the magnitude of the amplitude of the oscillation signal OSC. Specifically, when the voltage generation circuit 51 of the power supply control circuit 50 generates the variable bias voltage VBST, the threshold voltage VT is also variably changed. The comparison circuit 52 of the power supply control circuit 50 compares the output voltage VDQ of the amplitude detection circuit 40 with the variable threshold voltage VT, so that the magnitude of the amplitude of the oscillation signal OSC can be determined. In the example in FIG. 18 to be described later, the logic circuit 53 performs the determination process based on the detection signal SDT from the power supply control circuit 50.

As described above, in the embodiment, the amplitude detection circuit 40 detects the amplitude of the oscillation signal OSC by detecting the envelope of the oscillation signal OSC. For example, the amplitude detection circuit 40 performs the detection to extract the envelope of the oscillation signal OSC. For example, the envelope detection is implemented by the amplitude detection circuit 40 detecting and holding the peak voltage of the sine wave oscillation signal OSC. Accordingly, the output voltage VDQ as indicated by G3 and G4 in FIGS. 13 and 14 is output from the amplitude detection circuit 40 as the amplitude detection signal. The power supply control circuit 50 controls the regulator 92 based on the output voltage VDQ of the amplitude detection circuit 40, which is the amplitude detection signal, such that the regulated power supply voltage RGB becomes smaller than the amplitude of the oscillation signal OSC. In this manner, the amplitude detection circuit 40 detects the envelope of the oscillation signal OSC, so that the peak voltage or the like of the oscillation signal OSC is output from the amplitude detection circuit 40 as the voltage of the amplitude of the oscillation signal OSC. The power supply control circuit 50 uses the output voltage VDQ of the amplitude detection circuit 40 as the amplitude detection signal of the oscillation signal OSC, and can perform control such that the regulated power supply voltage RGB becomes smaller than the amplitude of the oscillation signal OSC.

In the embodiment, the amplitude detection circuit 40 sets the bias voltage VBS for the oscillation signal OSC whose DC component is cut by the capacitor CB1, and outputs the output voltage VDQ generated by detecting the envelope of the oscillation signal in which the bias voltage VBS is set. Then, the power supply control circuit 50 compares the output voltage VDQ of the amplitude detection circuit 40 with the threshold voltage VT which is the voltage higher than the bias voltage VBS. For example, in G3 of FIG. 13, the comparison circuit 52 of the power supply control circuit 50 compares the output voltage VDQ with the threshold voltage VT which is the voltage higher than the bias voltage VBS, the output voltage VDQ is higher than the threshold voltage VT, and thus, the detection signal SDT is set to the active level. Further, in G4 of FIG. 14, the comparison circuit 52 compares the output voltage VDQ with the threshold voltage VT which is the voltage higher than the bias voltage VBS, the output voltage VDQ is lower than the threshold voltage VT, and thus, the detection signal SDT is set to the inactive level. In this manner, the envelope of the oscillation signal OSC in which the bias voltage VBS is set to the amplitude center voltage can be detected. By comparing the output voltage VDQ generated by the envelope detection with the threshold voltage VT set to a voltage higher than the bias voltage, it is possible to determine whether the peak voltage corresponding to the amplitude of the oscillation signal OSC is higher or lower than the threshold voltage VT. Accordingly, the magnitude of the amplitude of the oscillation signal OSC can be determined by envelope detection performed by the amplitude detection circuit 40 and setting of the bias voltage VBS and the threshold voltage VT.

Figure 15:
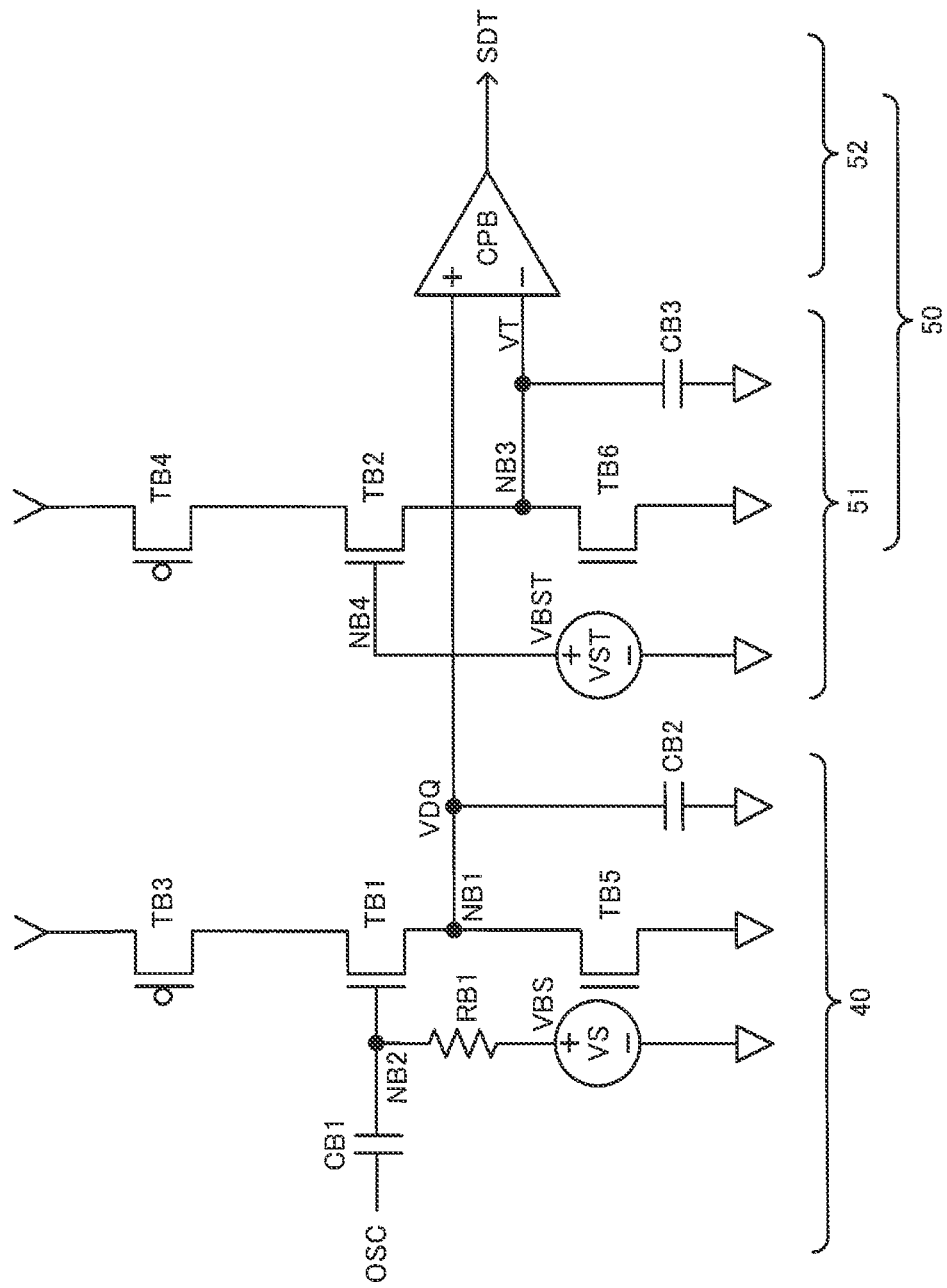
FIG. 15 shows another configuration example of the amplitude detection circuit and the power supply control circuit.

Various modifications can be made to the configurations of the amplitude detection circuit 40 and the power supply control circuit 50. FIGS. 15 to 18 show another configuration example of the amplitude detection circuit 40 and the power supply control circuit 50. In FIG. 15, transistors TB5 and TB6 are provided as current sources instead of the resistors RB2 and RB3 in FIG. 12. That is, the N-type transistors TB5 and TB6 operate as the current sources that cause a constant current to flow by controlling gates of the N-type transistors TB5 and TB6. A current flowing capacity of the current sources of the transistors TB5 and TB6 is sufficiently smaller than the current supply capacity of the transistors TB1 and TB2. Accordingly, for example, at the node NB1 of the drain of the transistor TB1, the peak voltage of the oscillation signal OSC is held, and the envelope of the oscillation signal OSC can be detected.

Figure 16:
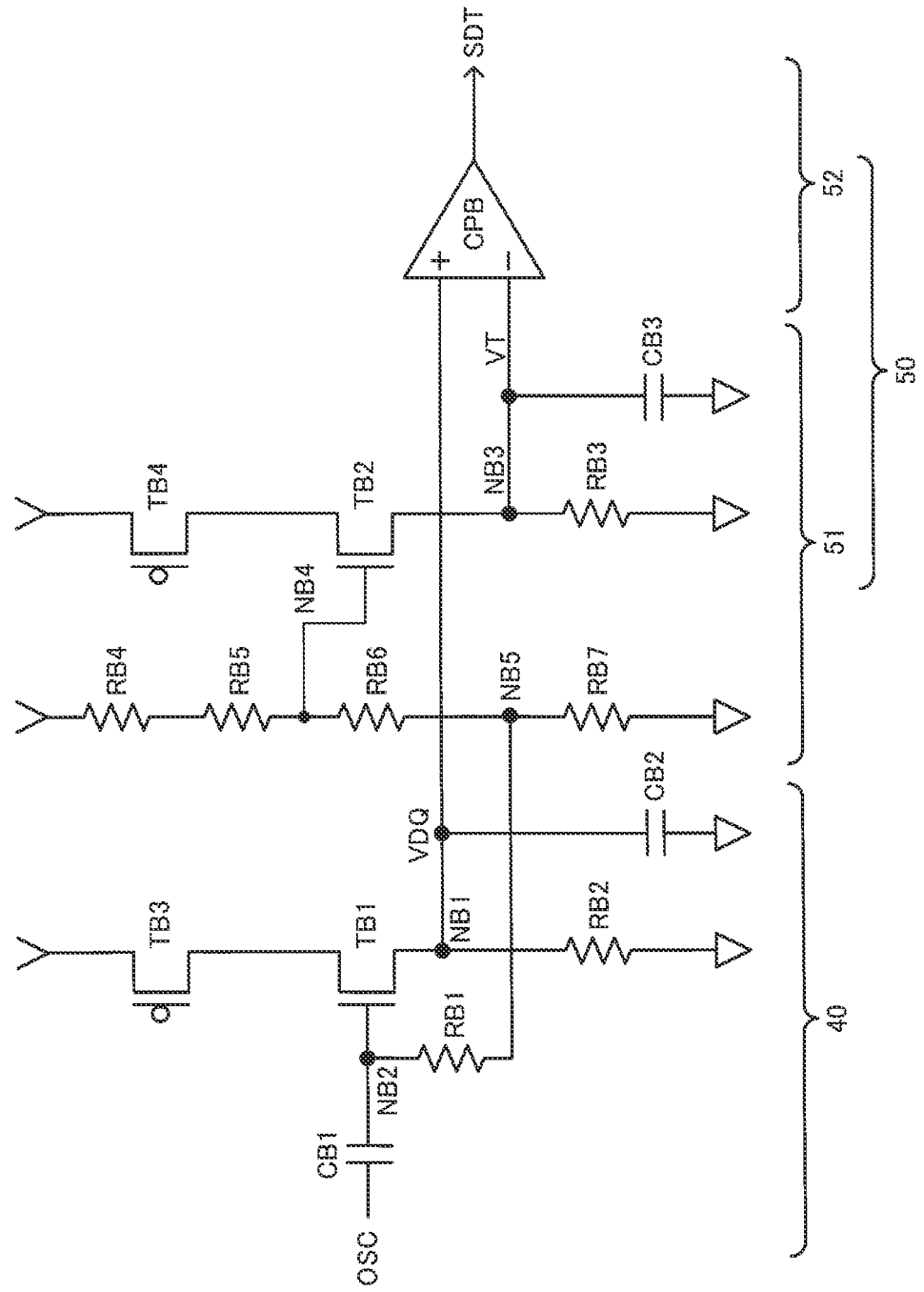
FIG. 16 shows another configuration example of the amplitude detection circuit and the power supply control circuit.
Figure 17:
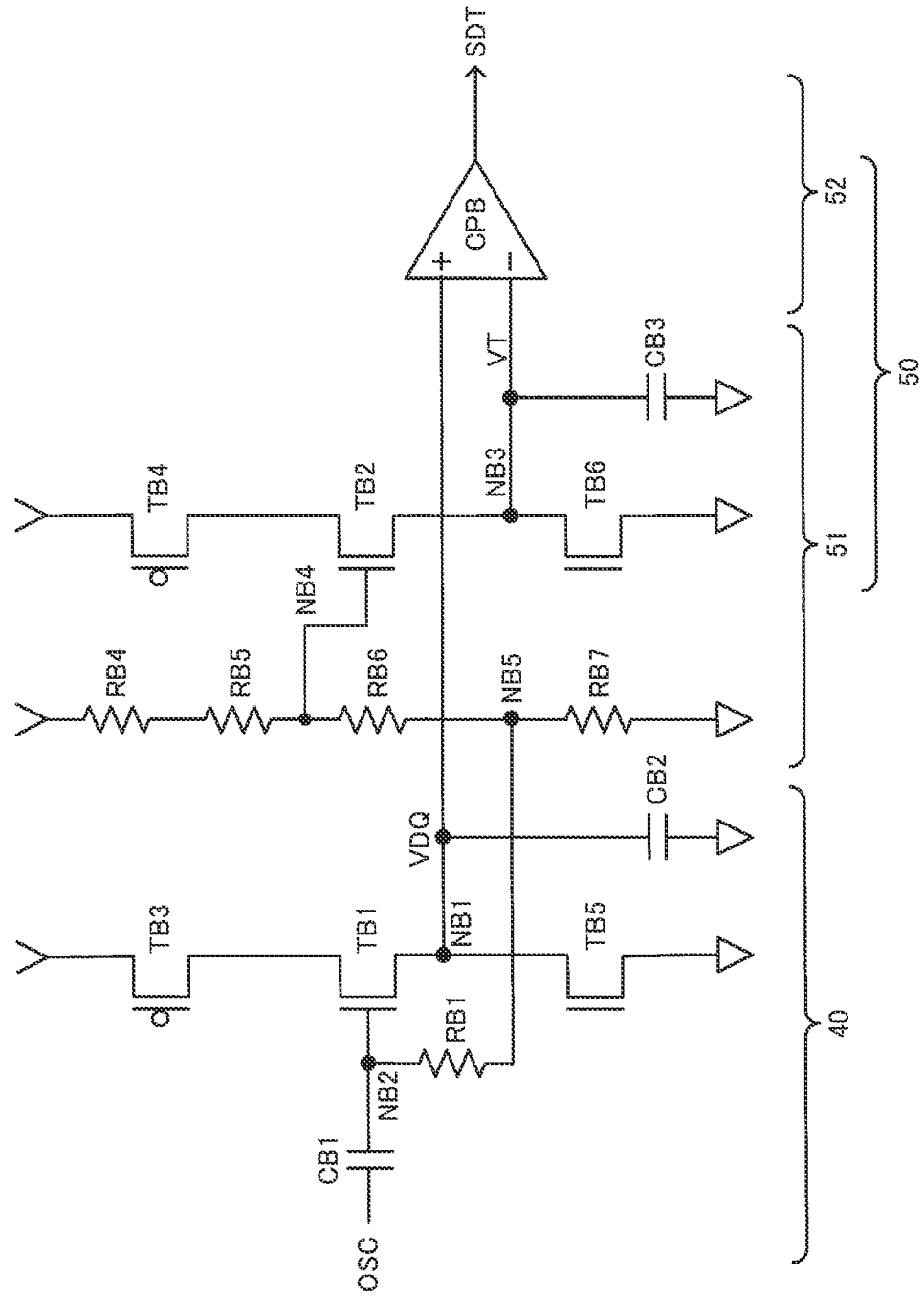
FIG. 17 shows another configuration example of the amplitude detection circuit and the power supply control circuit.

In FIG. 16, a resistance division circuit including resistors RB1, RB4, RB5, RB6, and RB7 is provided instead of the voltage sources VS and VST in FIG. 12. The resistors RB4, RB5, RB6, and RB7 are provided in series between the power supply node and the GND node. The resistor RB1 is provided between a node NB5, which is a coupling node between the resistor RB6 and the resistor RB7, and the node NB2, which is the gate node of the transistor TB1. In this manner, the voltage of the node NB4 and the voltage of the node NB5 can be set based on a resistance division ratio by the resistance division circuit. Then, the voltage of the node NB5 can be set to the bias voltage VBS in FIG. 12, and the voltage of the node NB4 can be set to the bias voltage VBST. In this case, the resistance division circuit can variably set the resistance ratio, and accordingly, the threshold voltage VT to be compared with the output voltage VDQ of the amplitude detection circuit 40 can be variably set. In FIG. 17, the resistors RB2 and RB3 in the configuration in FIG. 16 are replaced with transistors TB5 and TB6 serving as the current sources as in FIG. 15, and the other configuration is the same as in FIG. 16.

FIG. 18 is a diagram showing a detailed configuration example of the power supply control circuit 50. In FIG. 18, the power supply control circuit 50 includes the voltage generation circuit 51 that generates the variable threshold voltage VT, the comparison circuit 52 that compares the output voltage VDQ which is the amplitude detection signal of the amplitude detection circuit 40 with the threshold voltage VT, and the logic circuit 53. Then, the logic circuit 53 sets the regulated power supply voltage VRGB of the regulator 92 based on the comparison result of the comparison circuit 52. For example, the logic circuit 53 performs control to set the regulated power supply voltage VRGB based on the detection signal SDT which is the comparison result of the comparison circuit 52. For example, as indicated by G3 in FIG. 13, it is assumed that the output voltage VDQ of the amplitude detection circuit 40 is higher than the threshold voltage VT, and the detection signal SDT of the comparison circuit 52 reaches the active level. In this case, the logic circuit 53 determines that the regulated power supply voltage VRGB is smaller than the amplitude of the oscillation signal OSC. In addition, as indicated by G4 in FIG. 14, it is assumed that the output voltage VDQ of the amplitude detection circuit 40 is smaller than the threshold voltage VT, and the detection signal SDT of the comparison circuit 52 reaches the inactive level. In this case, the logic circuit 53 determines that the regulated power supply voltage VRGB is larger than the amplitude of the oscillation signal OSC. In this manner, the logic circuit 53 can determine the magnitude of the amplitude of the oscillation signal OSC based on the comparison result between the variable threshold voltage VT and the output voltage VDQ which is the amplitude detection signal of the amplitude detection circuit 40. Then, based on the determination result, the logic circuit 53 can control the regulator 92, such that the regulated power supply voltage VRGB becomes smaller than the amplitude of the oscillation signal OSC.

Figure 19:
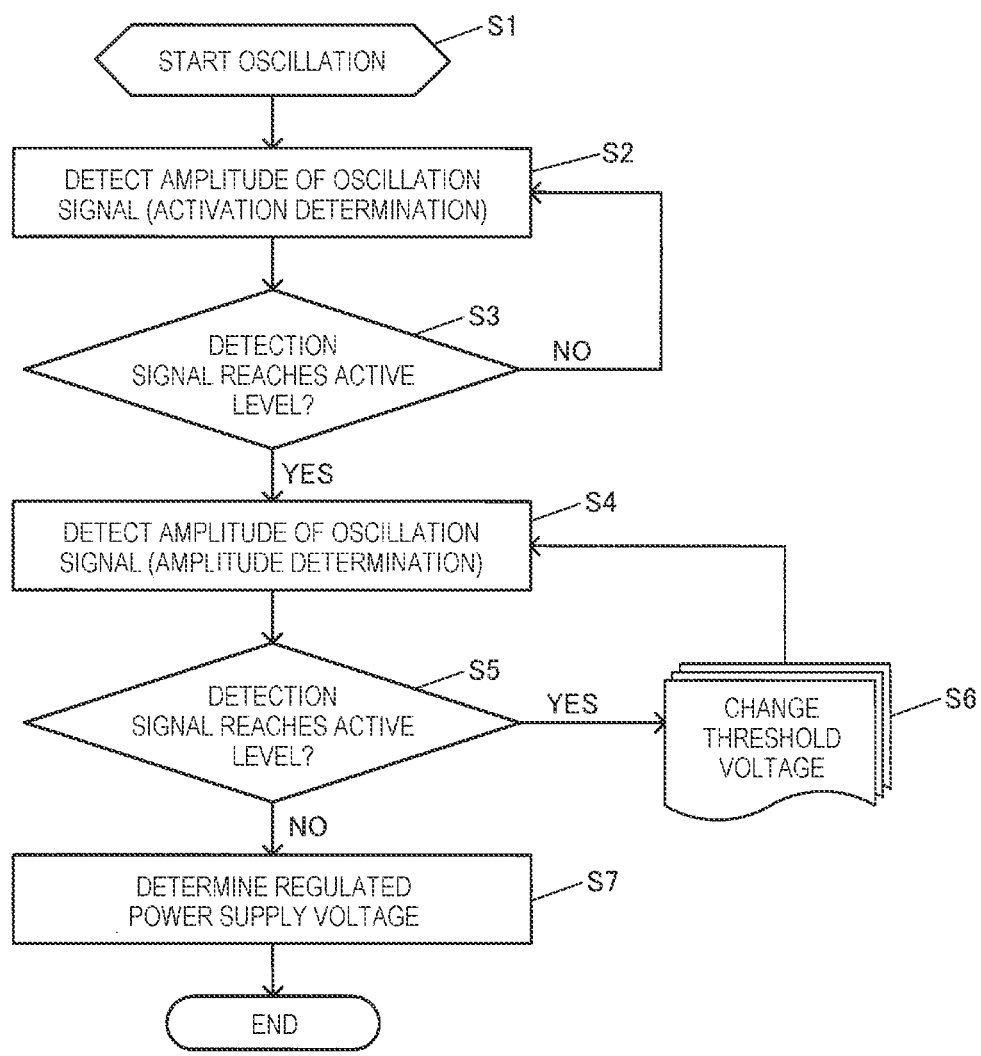
FIG. 19 is a flowchart showing operations according to the embodiment.

FIG. 19 is a flowchart showing operations according to the embodiment. When oscillation of the oscillator 4 is started by power-on or the like (step S1), the amplitude detection of the oscillation signal OSC for activation determination is performed (step S2). For example, it is detected whether the amplitude of the oscillation signal OSC increases gradually at the start of oscillation and reaches an amplitude at which it can be determined that the activation is appropriately performed. Specifically, the threshold voltage VT is set to a threshold voltage for activation determination by setting the variable bias voltage VBST in FIG. 12. The comparison circuit 52 compares the output voltage VDQ of the amplitude detection circuit 40 with the threshold voltage VT for the activation determination, thereby detecting the amplitude of the oscillation signal OSC for activation determination. The threshold voltage VT for activation determination is, for example, 1.0 V or less, and is, for example, about 0.5 V to 0.6 V. Then, it is determined whether the detection signal SDT of the comparison circuit 52 reaches the active level (step S3). For example, when the output voltage VDQ of the amplitude detection circuit 40 exceeds the threshold voltage VT for activation determination, the detection signal SDT of the comparison circuit 52 reaches the active level, and it is determined that the amplitude of the oscillation signal OSC becomes the amplitude at which it can be determined that the activation is appropriately performed. When the detection signal SDT reaches the active level, the amplitude of the oscillation signal OSC for the amplitude determination is detected (step S4). The amplitude detection for the amplitude determination is amplitude detection for controlling the regulated power supply voltage VRGB to be smaller than the amplitude of the oscillation signal OSC.

Next, in the amplitude detection of the oscillation signal OSC for the amplitude determination, it is determined whether the detection signal SDT of the comparison circuit 52 reaches the active level (step S5). For example, as indicated by G3 in FIG. 13, when the output voltage VDQ of the amplitude detection circuit 40 exceeds the threshold voltage VT for the amplitude determination, the detection signal SDT of the comparison circuit 52 reaches the active level. For example, when a positive logic is applied, the active level is the high level, and the inactive level is the low level. In this case, a process of changing the variable threshold voltage VT is performed (step S6), for example, the threshold voltage VT is increased, and the process returns to step S4. When the detection signal SDT does not reach the inactive level and remains at the active level as described above, the processes of steps S4, S5, and S6 are repeated to change the threshold voltage VT in a manner of gradually increasing the threshold voltage VT. When the detection signal SDT reaches the inactive level, the process proceeds to the determination process of the regulated power supply voltage VRGB (step S7). For example, the regulated power supply voltage VRGB is determined based on the threshold voltage VT detected last before the detection signal SDT reaches the inactive level. For example, in FIG. 13, the regulated power supply voltage VRGB is determined as a voltage corresponding to the threshold voltage VT immediately before exceeding the output voltage VDQ of the amplitude detection circuit 40. In this manner, the regulated power supply voltage VRGB can be set to an optimal voltage that is smaller than the amplitude of the oscillation signal OSC.

As described above, in the embodiment, the power supply control circuit 50 determines whether the voltage corresponding to the amplitude of the oscillation signal OSC exceeds the threshold voltage VT for activation determination at the time of activation, and performs control on the regulator 92 based on the amplitude detection signal SDT when the voltage corresponding to the amplitude of the oscillation signal OSC exceeds the threshold voltage VT for activation determination. The voltage corresponding to the amplitude is, for example, the voltage of the amplitude detection signal of the amplitude detection circuit 40, and is the output voltage VDQ of the amplitude detection circuit 40. The output voltage VDQ is, for example, the peak voltage of the oscillation signal OSC, and specifically, for example, the peak voltage of the oscillation signal OSC in which the bias voltage VBS is set to the amplitude center voltage. For example, in steps S2 and S3 in FIG. 19, when the amplitude detection of the oscillation signal OSC for activation determination is performed and the output voltage VDQ of the amplitude detection circuit 40, which is the voltage corresponding to the amplitude of the oscillation signal OSC, exceeds the threshold voltage VT for activation determination, the detection signal SDT of the comparison circuit 52 reaches the active level. Accordingly, the regulator 92 is controlled based on the amplitude detection signal as shown in steps S4 to S7 in FIG. 19. In this manner, the control on the regulated power supply voltage VRGB based on the amplitude detection signal of the oscillation signal OSC can be started after the amplitude of the oscillation signal OSC becomes an appropriate amplitude at which it can be determined that the oscillator 4 is activated.

For example, until the output voltage VDQ of the amplitude detection circuit 40 exceeds the threshold voltage VT for activation determination, the waveform shaping circuit 38 is set to an operation disabled state, and the waveform shaping of the oscillation signal OSC is not performed. In addition, the output circuit 80, the temperature compensation circuit 70, the temperature sensor 72, and the like in FIG. 2 are also set to the operation disabled state. In this manner, it is possible to prevent power from being wasted in the waveform shaping circuit 38 or the like before the oscillator 4 (circuit device) is activated. In a case where the waveform shaping circuit 38 performs the waveform shaping when the amplitude of the oscillation signal OSC is not appropriate, a large through current may be generated in the waveform shaping circuit 38 or the inappropriate clock signal CK may be output. In this regard, as long as the waveform shaping circuit 38 and the like are set to the operation disabled state until the detection signal SDT for activation determination reaches the active level in step S3 in FIG. 19, the occurrence of such a situation can be prevented. Then, after the detection signal SDT for activation determination reaches the active level in step S3, it is possible to appropriately perform the control of the regulated power supply voltage VRGB based on the amplitude detection result of the oscillation signal OSC as described with reference to FIGS. 5 and 6.

In the embodiment, the power supply control circuit 50 determines whether the voltage corresponding to the amplitude exceeds the threshold voltage VT for activation determination based on the amplitude detection signal from the amplitude detection circuit 40. For example, the power supply control circuit 50 determines whether the output voltage VDQ, which is the amplitude detection signal from the amplitude detection circuit 40, exceeds the threshold voltage VT set for the activation determination. In this manner, the amplitude detection circuit 40 and the power supply control circuit 50 can be used for both the amplitude detection for the activation determination and the power supply control and the amplitude detection for the amplitude determination and the power supply control. For example, according to the embodiment, the amplitude detection circuit 40 and the power supply control circuit 50 provided for the activation determination can be used as the amplitude detection circuit and the power supply control circuit for controlling the regulator 92 based on the amplitude detection result. Accordingly, it is not necessary to separately provide the amplitude detection circuit 40 and the power supply control circuit 50 for the activation determination and the amplitude determination, respectively, and thus, it is possible to prevent an increase in a circuit scale of the circuit device 20.

In the embodiment, the logic circuit 53 sets the threshold voltage VT to a first voltage V1, and sets the threshold voltage to a second voltage V2 higher than the first voltage V1 when the voltage corresponding to the amplitude of the oscillation signal OSC exceeds the first voltage V1. For example, in steps S4 and S5 in FIG. 19, the logic circuit 53 sets the threshold voltage VT to the first voltage V1, and the comparison circuit 52 determines whether the output voltage VDQ which is the voltage corresponding to the amplitude exceeds VT=V1. When the output voltage VDQ exceeds VT=V1, the detection signal SDT of the comparison circuit 52 reaches the active level, and a process is performed in which the logic circuit 53 changes the threshold voltage VT to the second voltage V2 higher than the first voltage V1 as shown in step S6. In this manner, the threshold voltage VT close to the voltage corresponding to the amplitude can be specified by comparing the voltage corresponding to the amplitude of the oscillation signal OSC with the threshold voltage VT while changing the threshold voltage VT from a low voltage to a high voltage. Accordingly, it is possible to specify the amplitude of the oscillation signal OSC and implement control such that the regulated power supply voltage VRGB becomes smaller than the amplitude.

When the voltage corresponding to the amplitude of the oscillation signal OSC does not exceed the second voltage V2, the logic circuit 53 sets the regulated power supply voltage VRGB to a voltage equal to or lower than the first voltage V1. For example, when the threshold voltage VT is set to the first voltage V1 and the output voltage VDQ corresponding to the amplitude exceeds VT=V1 in steps S4 and S5 in FIG. 19 as described above, the threshold voltage VT is set to the second voltage V2 higher than the first voltage V1 in step S6. Then, in steps S4 and S5, it is determined again whether the output voltage VDQ exceeds the threshold voltage VT=V2. When the output voltage VDQ corresponding to the amplitude exceeds the threshold voltage VT=V2, the threshold voltage VT is set to a third voltage V3 higher than the second voltage V2 as shown in step S6. On the other hand, when the output voltage VDQ does not exceed the threshold voltage VT=V2 in step S5, the process proceeds to step S7, and the regulated power supply voltage VRGB is set to a voltage equal to or lower than the first voltage V1. In this manner, when the output voltage VDQ corresponding to the amplitude is between the first voltage V1 and the second voltage V2 and a relationship of V1<VDQ<V2 is satisfied, the regulated power supply voltage VRGB is set to a voltage equal to or lower than the first voltage V1. Accordingly, the regulated power supply voltage VRGB can be set to a voltage that does not exceed the output voltage VDQ corresponding to the amplitude and that is close to the output voltage VDQ corresponding to the amplitude, and appropriate control can be implemented, such that the regulated power supply voltage VRGB becomes smaller than the amplitude of the oscillation signal OSC.

Figure 20:
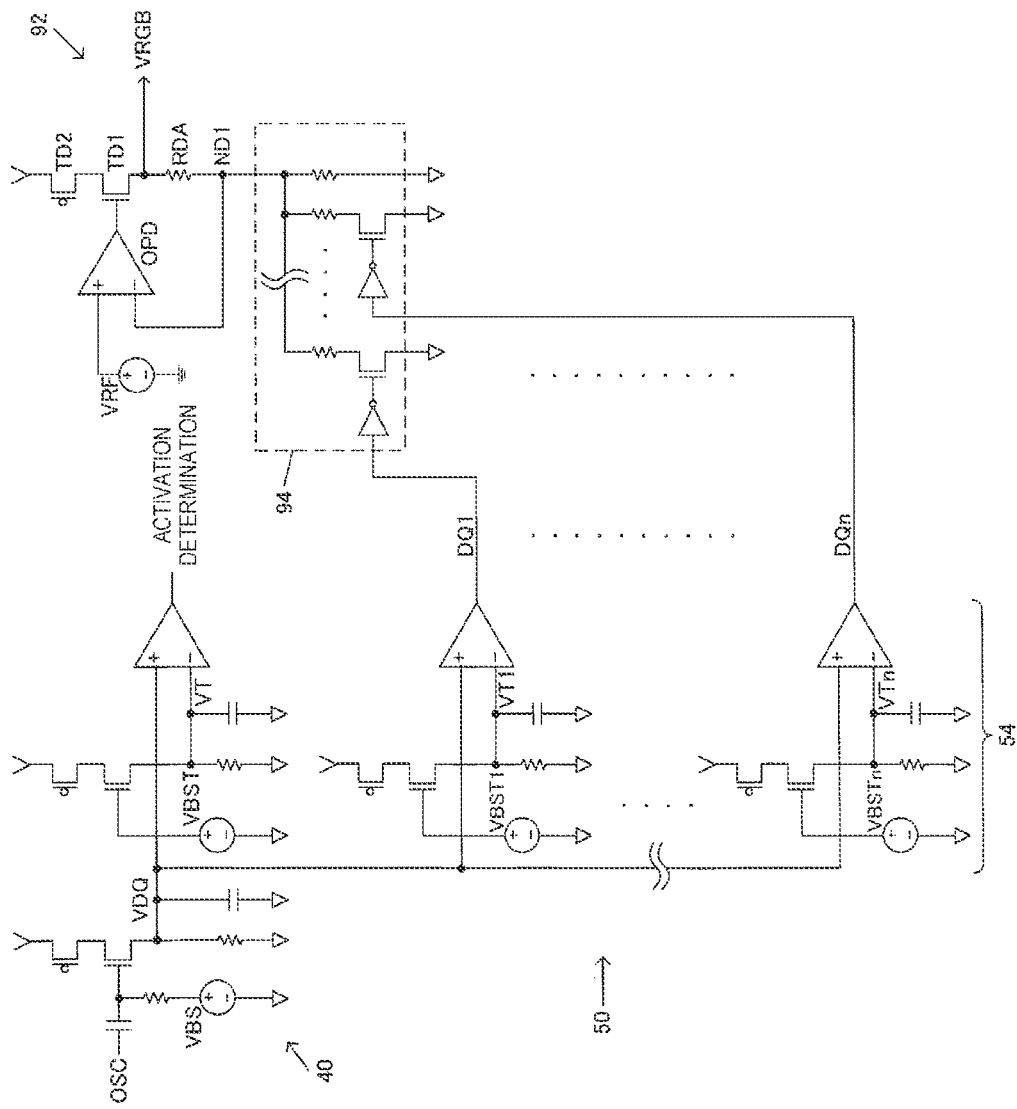
FIG. 20 shows another configuration example of the power supply control circuit.
Figure 21:
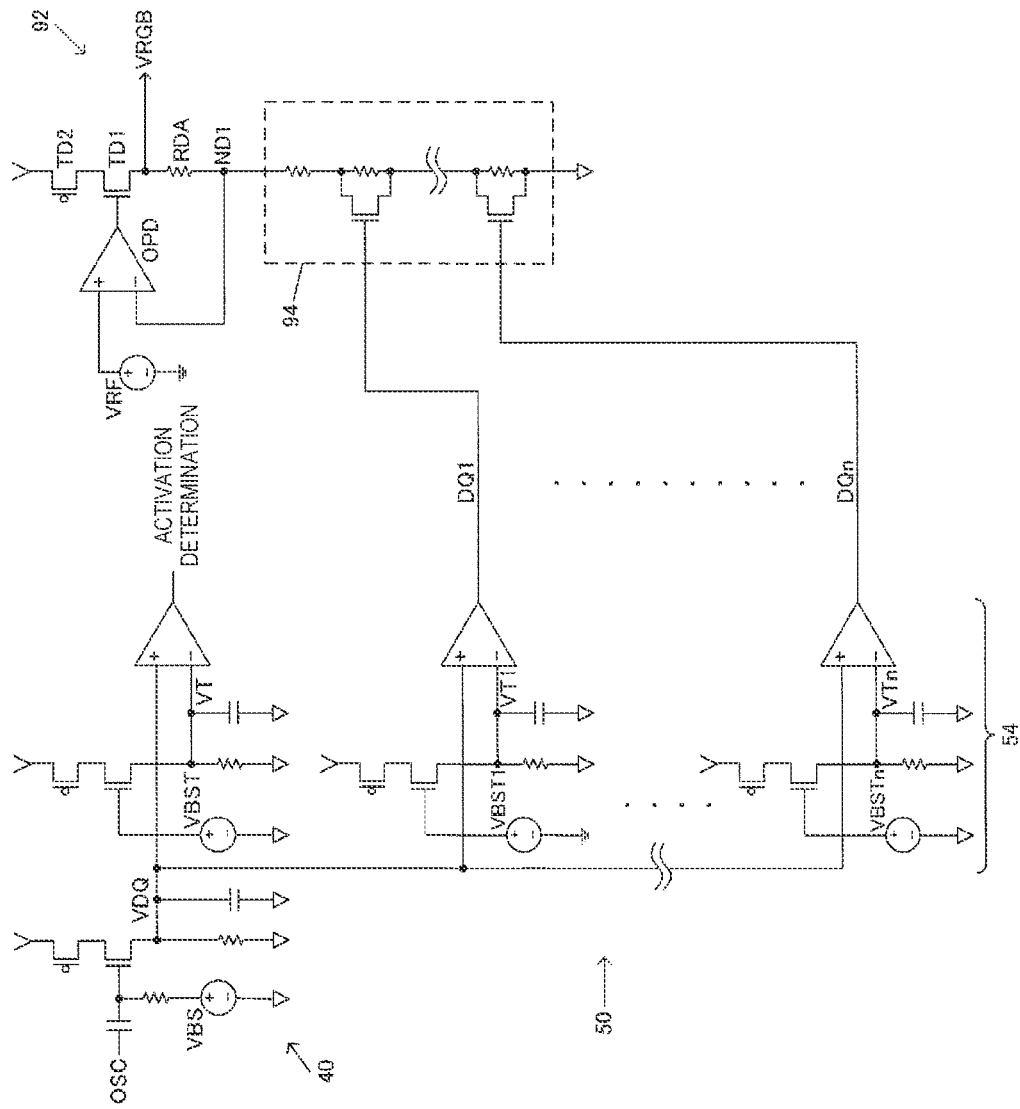
FIG. 21 shows another configuration example of the power supply control circuit.

The configuration of the power supply control circuit 50 is not limited to the configuration in FIG. 18, and various modifications can be made. For example, FIGS. 20 and 21 show other configuration examples of the power supply control circuit 50. In FIGS. 20 and 21, the power supply control circuit 50 includes a determination circuit 54 that compares the voltage corresponding to the amplitude of the oscillation signal OSC with first to n-th threshold voltages and outputs first to n-th determination results. Here, n is an integer of 2 or more. The regulator 92 generates the regulated power supply voltage VRGB based on the first to n-th determination results from the determination circuit 54. In this way, by controlling the regulator 92 based on the first to n-th determination results obtained by comparing the voltage corresponding to the amplitude of the oscillation signal OSC with the first to n-th threshold voltages, it is possible to implement control to make the regulated power supply voltage VRGB smaller than the amplitude of the oscillation signal OSC. For example, without using the logic circuit 53 as shown in FIG. 18, it is possible to implement control on the regulator 92 to make the regulated power supply voltage VRGB smaller than the amplitude of the oscillation signal OSC.

For example, in FIGS. 20 and 21, the determination circuit 54 includes n determination units, and a configuration of each determination unit is the same as the configuration of the voltage generation circuit 51 and the comparison circuit 52 described with reference to FIG. 12 and the like. For example, voltage generation circuits of the determination units generate threshold voltages VT1 to VTn based on bias voltages VBST1 to VBSTn of voltage sources provided in the determination units. The threshold voltages VT1 to VTn are first to n-th threshold voltages. The comparison circuits of the determination units compare the output voltage VDQ of the amplitude detection circuit 40 corresponding to the amplitude of the oscillation signal OSC with the threshold voltages VT1 to VTn, and output determination signals DQ1 to DQn as first to n-th determination results. For example, when the output voltage VDQ exceeds the threshold voltage VT1, the determination signal DQ1 reaches the active level. Similarly, when the output voltage VDQ exceeds the threshold voltage VT2, the determination signal DQ2 reaches the active level, . . . , and when the output voltage VDQ exceeds the threshold voltage VTn, the determination signal DQn reaches the active level. A resistance value of a variable resistance circuit 94 of the regulator 92 is controlled based on the determination signals DQ1 to DQn, so that the regulated power supply voltage VRGB output from the regulator 92 is controlled.

For example, in the regulator 92, the gate of the transistor TD1 is controlled by an output of an operational amplifier OPD in which the reference voltage VRF is input to the non-inverting input terminal that is the first input terminal. The inverting input terminal which is the second input terminal of the operational amplifier OPD is coupled to the node ND1 which is a coupling node between the resistor RDA and the variable resistance circuit 94. When the regulator 92 operates, the transistor TD2 is turned on. When a resistance value of the resistor RDA is R1 and the resistance value of the variable resistance circuit 94 is R2, the regulator 92 outputs the regulated power supply voltage VRGB that satisfies VRGB={(R1+R2)/R2}×VRF. Accordingly, since the resistance value R2 of the variable resistance circuit 94 is variably controlled based on the determination signals DQ1 to DQn, VRGB={(R1+R2)/R2}×VRF which is the regulated power supply voltage can be controlled. For example, in FIG. 20, the variable resistance circuit 94 includes a plurality of resistors provided in parallel between the node ND1 and the GND node. The resistance value R2 of the variable resistance circuit 94 is controlled by controlling on and off of the transistors provided in series with the resistors based on the determination signals DQ1 to DQn. On the other hand, in FIG. 21, the variable resistance circuit 94 includes a plurality of resistors provided in series between the node ND1 and the GND node. The resistance value R2 of the variable resistance circuit 94 is controlled by controlling on and off of the transistors provided in parallel with the resistors based on the determination signals DQ1 to DQn.

As described above, the circuit device according to the embodiment includes an oscillation circuit configured to generate an oscillation signal, a waveform shaping circuit configured to receive the oscillation signal and perform waveform shaping on the oscillation signal, and a regulator configured to supply a regulated power supply voltage to the waveform shaping circuit. The circuit device includes an amplitude detection circuit configured to detect an amplitude of the oscillation signal and output an amplitude detection signal, and a power supply control circuit configured to perform control on the regulator based on the amplitude detection signal, such that the regulated power supply voltage becomes smaller than the amplitude of the oscillation signal.

According to the embodiment, the amplitude of the oscillation signal is detected, and the regulated power supply voltage smaller than the amplitude of the oscillation signal can be reliably supplied to the waveform shaping circuit. Accordingly, the oscillation signal having the amplitude smaller than the regulated power supply voltage is not necessary to be subjected to the waveform shaping in the waveform shaping circuit, and thus, a through current can be prevented from being generated during the waveform shaping, for example. In addition, it is possible to reduce noise of the signal after the waveform shaping, and the like.

In the embodiment, the amplitude detection circuit may detect the amplitude of the oscillation signal by detecting an envelope of the oscillation signal.

In this manner, the amplitude detection circuit detects the envelope of the oscillation signal, so that a voltage corresponding to the amplitude of the oscillation signal can be output from the amplitude detection circuit.

In the embodiment, the power supply control circuit may include a voltage generation circuit configured to generate a variable threshold voltage, a comparison circuit configured to compare an output voltage which is the amplitude detection signal of the amplitude detection circuit with the threshold voltage, and a logic circuit configured to set the regulated power supply voltage of the regulator based on a comparison result of the comparison circuit.

In this manner, the logic circuit can determine the magnitude of the amplitude of the oscillation signal based on the comparison result between the variable threshold voltage and the output voltage which is the amplitude detection signal of the amplitude detection circuit.

In the embodiment, the logic circuit may set the threshold voltage to a first voltage, and set the threshold voltage to a second voltage higher than the first voltage when a voltage corresponding to the amplitude exceeds the first voltage.

In this manner, the threshold voltage corresponding to the voltage corresponding to the amplitude can be specified by comparing the voltage corresponding to the amplitude of the oscillation signal with the threshold voltage while changing the threshold voltage from a low voltage to a high voltage.

In the embodiment, the logic circuit may set the regulated power supply voltage to a voltage equal to or lower than the first voltage when the voltage corresponding to the amplitude does not exceed the second voltage.

In this way, when the voltage corresponding to the amplitude is between the first voltage and the second voltage, the regulated power supply voltage is set to a voltage equal to or lower than the first voltage, and it is possible to implement appropriate control such that the regulated power supply voltage becomes smaller than the amplitude of the oscillation signal.

In the embodiment, the amplitude detection circuit may set the bias voltage for the oscillation signal whose DC component is cut by a capacitor, and output an output voltage generated by detecting an envelope of the oscillation signal in which the bias voltage is set. The power supply control circuit may compare the output voltage of the amplitude detection circuit with a threshold voltage which is a voltage higher than the bias voltage.

In this manner, the envelope of the oscillation signal in which the bias voltage is set can be detected, and by comparing the output voltage generated by the envelope detection with the threshold voltage set to a voltage higher than the bias voltage, it is possible to determine whether the voltage corresponding to the amplitude of the oscillation signal is higher or lower than the threshold voltage.

In the embodiment, the power supply control circuit may determine whether a voltage corresponding to the amplitude of the oscillation signal exceeds a threshold voltage for activation determination at a time of activation, and perform control on the regulator based on the amplitude detection signal when the voltage corresponding to the amplitude of the oscillation signal exceeds the threshold voltage for activation determination.

In this manner, the control of the regulated power supply voltage based on the amplitude detection signal of the oscillation signal can be started after the amplitude of the oscillation signal becomes an appropriate amplitude at which it can be determined that the activation is performed.

In the embodiment, the power supply control circuit may determine whether the voltage corresponding to the amplitude exceeds the threshold voltage for activation determination based on the amplitude detection signal from the amplitude detection circuit.

In this manner, the amplitude detection circuit and the power supply control circuit can be used for both the amplitude detection for the activation determination and power supply control and the amplitude detection for the amplitude determination and the power supply control.

In the embodiment, the power supply control circuit may include a determination circuit configured to compare a voltage corresponding to the amplitude of the oscillation signal with first to n-th threshold voltages and output first to n-th determination results (n is an integer of 2 or more). The regulator may generate the regulated power supply voltage based on the first to n-th determination results from the determination circuit.

In this way, by controlling the regulator based on the first to n-th determination results obtained by comparing the voltage corresponding to the amplitude of the oscillation signal with the first to n-th threshold voltages, it is possible to implement control to make the regulated power supply voltage smaller than the amplitude of the oscillation signal.

An oscillator according to the embodiment includes a resonator and the circuit device described above.

Although the embodiment is described in detail above, it can be easily understood by those skilled in the art that a number of modifications are possible without substantially departing from the novel matters and effects of the disclosure. Accordingly, all such modifications are within the scope of the disclosure. For example, a term described at least once together with a different term having a broader meaning or the same meaning in the description or the drawings can be replaced with the different term at any place in the description or the drawings. All combinations of the embodiment and the modifications are also included in the scope of the disclosure. The configurations, operations, and the like of the circuit device and the oscillator are not limited to those described in the embodiment, and various modifications can be made.

What is claimed is:

1. A circuit device comprising:
   an oscillation circuit configured to generate an oscillation signal;
   a waveform shaping circuit configured to receive the oscillation signal and perform waveform shaping on the oscillation signal;
   a regulator configured to supply a regulated power supply voltage to the waveform shaping circuit;
   an amplitude detection circuit configured to detect an amplitude of the oscillation signal and output an amplitude detection signal; and
   a power supply control circuit configured to perform control on the regulator based on the amplitude detection signal, such that the regulated power supply voltage becomes smaller than the amplitude of the oscillation signal.

2. The circuit device according to claim 1, wherein
   the amplitude detection circuit detects the amplitude of the oscillation signal by detecting an envelope of the oscillation signal.

3. The circuit device according to claim 1, wherein
   the power supply control circuit includes
   a voltage generation circuit configured to generate a variable threshold voltage,
   a comparison circuit configured to compare an output voltage which is the amplitude detection signal of the amplitude detection circuit with the threshold voltage, and
   a logic circuit configured to set the regulated power supply voltage of the regulator based on a comparison result of the comparison circuit.

4. The circuit device according to claim 3, wherein
   the logic circuit sets the threshold voltage to a first voltage, and sets the threshold voltage to a second voltage higher than the first voltage when a voltage corresponding to the amplitude exceeds the first voltage.

5. The circuit device according to claim 4, wherein
the logic circuit sets the regulated power supply voltage to a voltage equal to or lower than the first voltage when the voltage corresponding to the amplitude does not exceed the second voltage.

6. The circuit device according to claim 1, wherein
the amplitude detection circuit sets a bias voltage for the oscillation signal whose DC component is cut by a capacitor, and outputs an output voltage generated by detecting an envelope of the oscillation signal in which the bias voltage is set, and
the power supply control circuit compares the output voltage of the amplitude detection circuit with a threshold voltage which is a voltage higher than the bias voltage.

7. The circuit device according to claim 1, wherein
the power supply control circuit determines whether a voltage corresponding to the amplitude of the oscillation signal exceeds a threshold voltage for activation determination at a time of activation, and performs control on the regulator based on the amplitude detection signal when the voltage corresponding to the amplitude of the oscillation signal exceeds the threshold voltage for activation determination.

8. The circuit device according to claim 7, wherein
the power supply control circuit determines whether the voltage corresponding to the amplitude exceeds the threshold voltage for activation determination based on the amplitude detection signal from the amplitude detection circuit.

9. The circuit device according to claim 1, wherein
the power supply control circuit includes a determination circuit configured to compare a voltage corresponding to the amplitude of the oscillation signal with first to n-th threshold voltages and output first to n-th determination results (n is an integer of 2 or more), and
the regulator generates the regulated power supply voltage based on the first to n-th determination results from the determination circuit.

10. An oscillator comprising:
a resonator; and
a circuit device, wherein
the circuit device includes
    an oscillation circuit configured to oscillate the resonator and generate an oscillation signal;
    a waveform shaping circuit configured to receive the oscillation signal and perform waveform shaping on the oscillation signal;
    a regulator configured to supply a regulated power supply voltage to the waveform shaping circuit;
    an amplitude detection circuit configured to detect an amplitude of the oscillation signal and output an amplitude detection signal; and
    a power supply control circuit configured to perform control on the regulator based on the amplitude detection signal, such that the regulated power supply voltage becomes smaller than the amplitude of the oscillation signal.

* * * * *